US012666916B2

(12) United States Patent
Safrani et al.

(10) Patent No.: US 12,666,916 B2
(45) Date of Patent: Jun. 23, 2026

(54) TEACHING SUBSTRATE FOR PRODUCTION AND PROCESS-CONTROL TOOLS

(71) Applicant: KLA Corporation, Milpitas, CA (US)

(72) Inventors: Avner Safrani, Misgav (IL); Shai Mark, Kibutz Snir (IL); Amir Aizen, Haifa (IL); Maor Arbit, Haifa (IL)

( * ) Notice: Subject to any disclaimer, the term of this patent is extended or adjusted under 35 U.S.C. 154(b) by 236 days.

(21) Appl. No.: 18/424,421

(22) Filed: Jan. 26, 2024

(65) Prior Publication Data

US 2024/0170318 A1      May 23, 2024

Related U.S. Application Data

(62) Division of application No. 17/013,213, filed on Sep. 4, 2020, now Pat. No. 11,908,722.

(60) Provisional application No. 62/897,545, filed on Sep. 9, 2019.

(51) Int. Cl.
*H10P 72/50* (2026.01)
*H10P 72/00* (2026.01)
*H10P 72/76* (2026.01)

(52) U.S. Cl.
CPC .......... *H10P 72/53* (2026.01); *H10P 72/0606* (2026.01); *H10P 72/7602* (2026.01)

(58) Field of Classification Search
CPC ............. H01L 21/681; H01L 21/67259; H01L 21/68707
See application file for complete search history.

(56) References Cited

U.S. PATENT DOCUMENTS

| | | | | |
|---|---|---|---|---|
| 5,981,966 A | * | 11/1999 | Honma | ............. H01L 21/67259 |
| | | | | 414/172 |
| 6,895,831 B2 | | 5/2005 | Hunter | |
| 7,029,930 B2 | | 4/2006 | Tomer et al. | |
| 2003/0202092 A1 | | 10/2003 | Sadighi et al. | |
| 2003/0223057 A1 | | 12/2003 | Ramsey et al. | |
| 2006/0171561 A1 | | 8/2006 | Ramsey et al. | |
| 2007/0065144 A1 | | 3/2007 | Hofmeister et al. | |
| 2009/0062959 A1 | | 3/2009 | Sakhare et al. | |
| 2009/0279989 A1 | | 11/2009 | Wong et al. | |
| 2011/0129947 A1 | | 6/2011 | Mangum et al. | |
| 2019/0035664 A1 | * | 1/2019 | Lin | ....................... G06T 7/0004 |
| 2019/0051546 A1 | | 2/2019 | Lee et al. | |

(Continued)

FOREIGN PATENT DOCUMENTS

| | | | | |
|---|---|---|---|---|
| CN | 102598239 A | | 7/2012 | |
| CN | 104626147 A | * | 5/2015 | ........... H01L 21/677 |
| CN | 109100920 A | | 12/2018 | |

(Continued)

OTHER PUBLICATIONS

Machine translation of CN 104626147 A (Year: 2015).*

(Continued)

*Primary Examiner* — Seung C Sohn

(74) *Attorney, Agent, or Firm* — Hodgson Russ LLP

(57) ABSTRACT

A substrate is to be loaded into an equipment front-end module of a fabrication or inspection tool. A first camera is situated on the substrate to image regions to a side of the substrate. A second camera is situated on the substrate to image regions below the substrate. One or more wireless transceivers on the substrate to transmit images captured by the first and second cameras.

20 Claims, 21 Drawing Sheets

(56) References Cited

U.S. PATENT DOCUMENTS

| 2019/0067057 A1 | 2/2019 | Hu et al. |
| 2019/0172742 A1 | 6/2019 | Mochizuki |

FOREIGN PATENT DOCUMENTS

| CN | 109427633 A | 3/2019 |
| CN | 109994404 A | 7/2019 |
| CN | 110168712 A | 8/2019 |
| JP | 2019102728 A | 6/2019 |
| KR | 101987895 B1 | 6/2019 |
| TW | 201634198 A | 10/2016 |
| TW | 201842606 A | 12/2018 |
| TW | 201910080 A | 3/2019 |

OTHER PUBLICATIONS

Machine translation of CN 109994404 A (IDS) (Year: 2019).*
Machine translation of CN 110168712 (IDS) (Year: 2019).*

TW Intellectual Property Office, Office Action for TW Patent App. No. 109130870, Feb. 1, 2024 (translation and original).
China National Intellectual Property Administration, First Office Action for CN Appl. No. 202080061550.8, Oct. 17, 2024 (uncertified translation and original).
CyberOptics Corp., "CyberOptics Semiconductor Application Note: Tokyo Electron Limited ACT Robot Teaching," 2014, available at http://www.cyberoptics.com/download/semiconductor/wafersense/ATS-922-0508-00-REV_B.pdf (downloaded Jun. 3, 2020).
CyberOptics Corp., "WaferSense(r) Auto Teaching System (ATS)," 2019, available at http://www.cyberoptics.com/download/semiconductor/wafersense/ATS-8022162-REV_F.pdf (downloaded Jun. 3, 2020).
CyberOptics Corp., "WaferSense(r) Auto Teaching System(tm) (ATS)," 2019, available at https://www.cyberoptics.com/products/wafersense-auto-teaching-system/ (downloaded Jun. 3, 2020).
CyberOptics Corp., "WaferSense(tm) Auto Teaching System Theory of Operation," 2014, available at http://www.cyberoptics.com/download/semiconductor/wafersense/ATS-8022418-REV_A.pdf (downloaded Jun. 3, 2020).
PCT/US2020/049779, International Search Report, Dec. 18, 2020.
PCT/US2020/049779, Written Opinion of the International Searching Authority, Dec. 18, 2020.

* cited by examiner

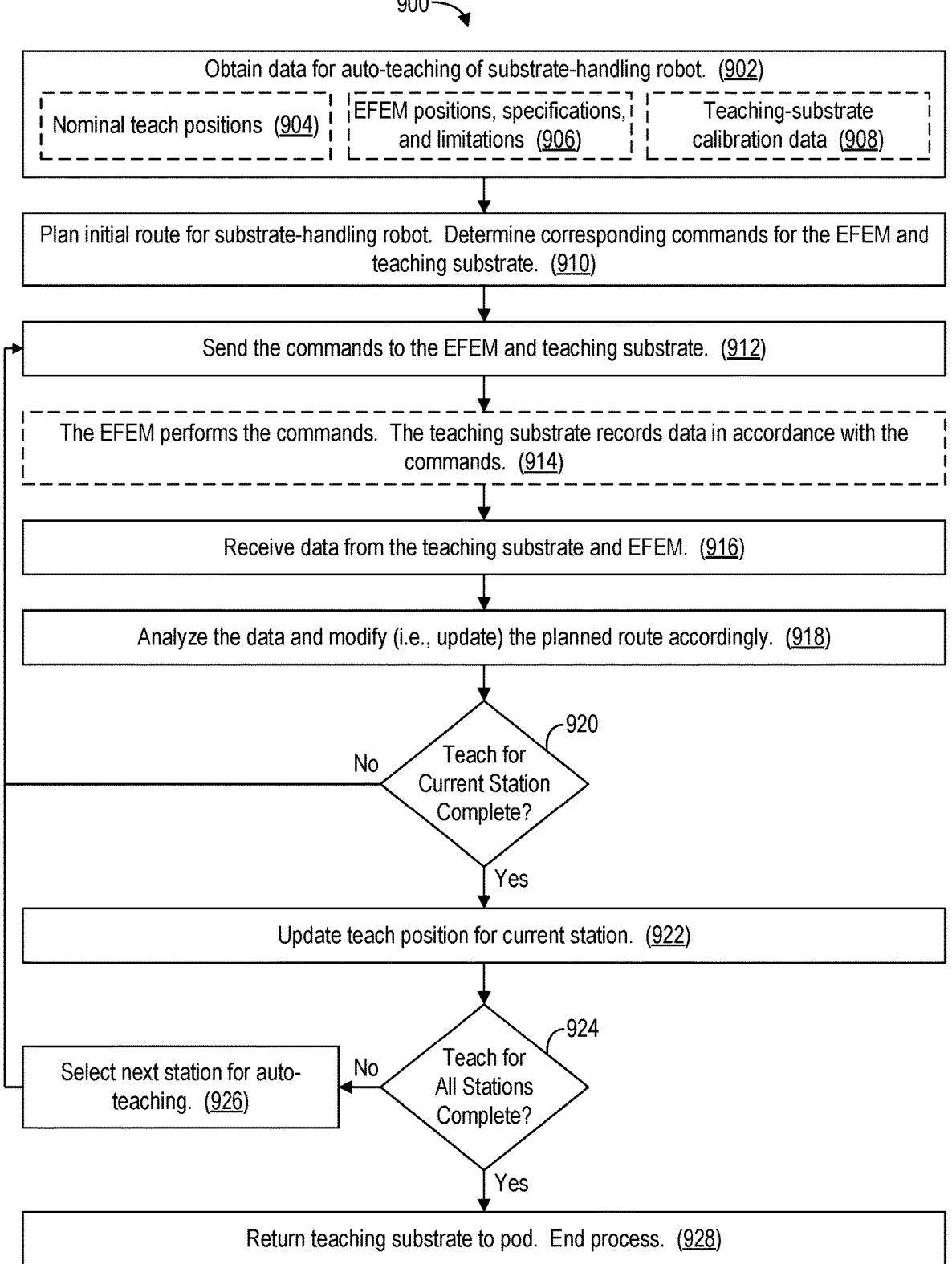

900

Obtain data for auto-teaching of substrate-handling robot. (902)

Nominal teach positions (904)

EFEM positions, specifications, and limitations (906)

Teaching-substrate calibration data (908)

Plan initial route for substrate-handling robot. Determine corresponding commands for the EFEM and teaching substrate. (910)

Send the commands to the EFEM and teaching substrate. (912)

The EFEM performs the commands. The teaching substrate records data in accordance with the commands. (914)

Receive data from the teaching substrate and EFEM. (916)

Analyze the data and modify (i.e., update) the planned route accordingly. (918)

920

Teach for Current Station Complete?

No

Yes

Update teach position for current station. (922)

924

Teach for All Stations Complete?

No

Select next station for auto-teaching. (926)

Yes

Return teaching substrate to pod. End process. (928)

Figure 9

1000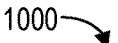

Load a teaching substrate into a load port of an EFEM of a fabrication or inspection tool.  The EFEM includes a substrate-handling robot.  A plurality of sensors and one or more wireless transceivers are on the teaching substrate.  The tool includes a plurality of stations.  (1002)

The plurality of sensors include a first camera to image regions in the EFEM to a side of the teaching substrate, a second camera to image regions in the EFEM below the teaching substrate (e.g., below the center of the teaching substrate), a third camera to image regions in the equipment front-end module below an edge of the teaching substrate, one or more distance-measuring sensors facing downward and/or sideways with respect to the teaching substrate, an IMU, and/or one or more accelerometers.  (1004)

Move the substrate-handling robot along an initial route.  (1006)

Wirelessly receive sensor data from the teaching substrate.  (1008)

Based at least in part on the sensor data, determine a modified route distinct from the initial route. (1010)

Move the substrate-handling robot along the modified route.  Handle the teaching substrate with the substrate-handling robot.  (1012)

Based at least in part on the sensor data, determine positions of the plurality of stations.  (1014)

Determine a production route through the EFEM, based at least in part on the determined positions of the plurality of stations.  (1016)

Unload the teaching substrate from the EFEM.  (1018)

Load production substrates into the EFEM and use the substrate-handling robot to move the production substrates along the production route through the EFEM.  (1020)

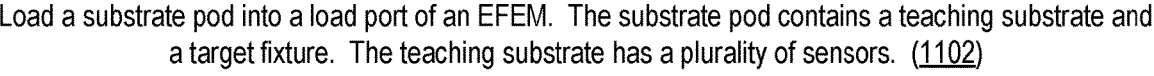

Load a substrate pod into a load port of an EFEM. The substrate pod contains a teaching substrate and a target fixture. The teaching substrate has a plurality of sensors. (1102)

A substrate-handling robot in the EFEM includes an end-effector to carry substrates. Insert the end-effector into the substrate pod. (1104)

The plurality of sensors includes a camera to image regions in the equipment front-end module below the teaching substrate. Wirelessly receive sensor data from the teaching substrate, including an image, taken by the camera, showing the end-effector and the target fixture. (1106)

Raise the end-effector toward the teaching substrate. (1108)

Move the end-effector along a route determined based at least in part on the image showing the end-effector and the target fixture. (1110)

The plurality of sensors also includes a distance-measuring sensor. Wirelessly receive sensor data from the teaching substrate, including a distance of the end-effector from the teaching substrate, as measured by the distance-measuring sensor after raising the end-effector toward the teaching substrate. (1112)

Positioning of the teaching substrate and end-effector in the substrate pod is determined, based at least in part on the image and the distance of the end-effector from the teaching substrate. (1114)

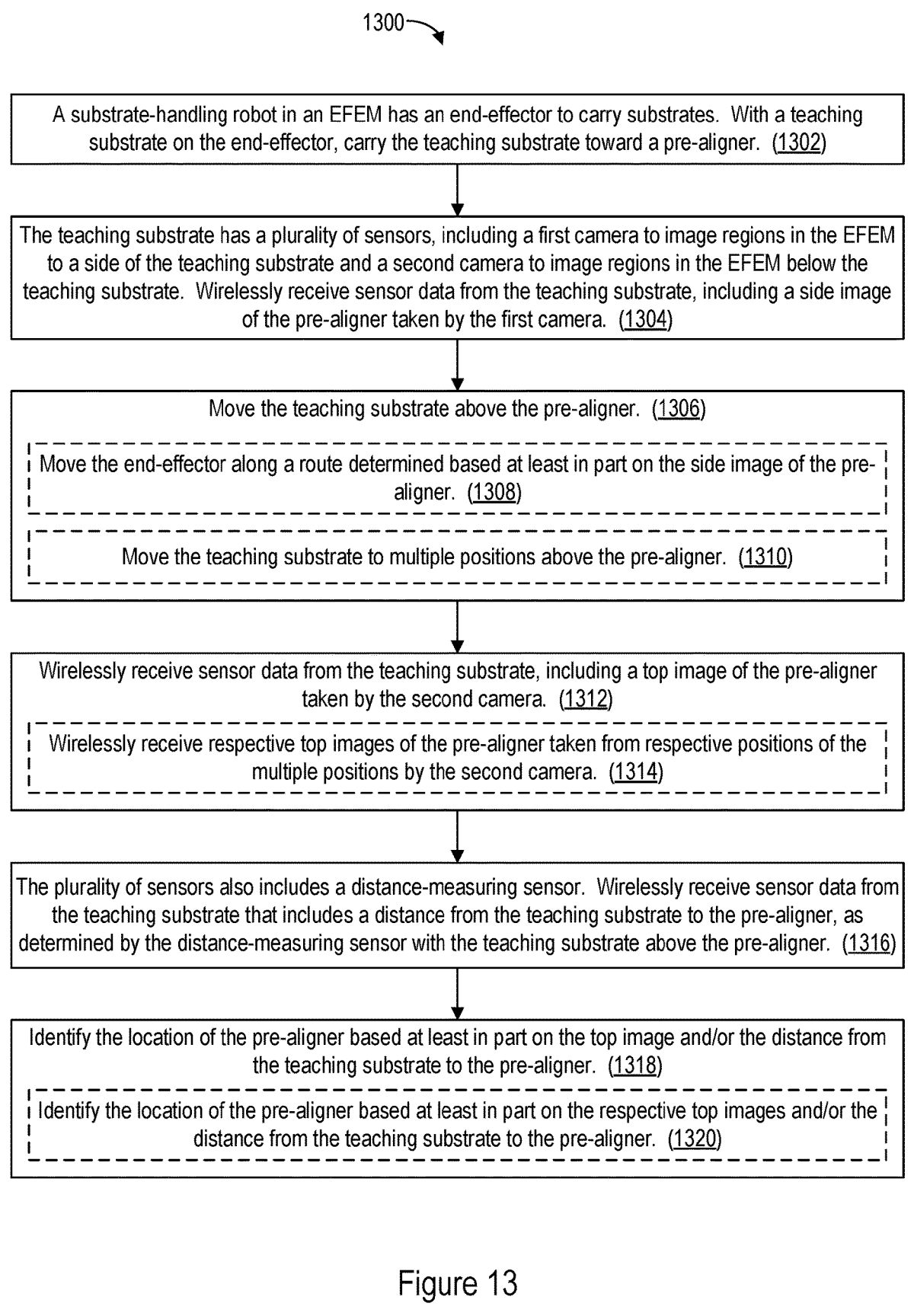

A substrate-handling robot in an EFEM has an end-effector to carry substrates. With a teaching substrate on the end-effector, carry the teaching substrate toward a pre-aligner. (1302)

↓

The teaching substrate has a plurality of sensors, including a first camera to image regions in the EFEM to a side of the teaching substrate and a second camera to image regions in the EFEM below the teaching substrate. Wirelessly receive sensor data from the teaching substrate, including a side image of the pre-aligner taken by the first camera. (1304)

↓

Move the teaching substrate above the pre-aligner. (1306)

Move the end-effector along a route determined based at least in part on the side image of the pre-aligner. (1308)

Move the teaching substrate to multiple positions above the pre-aligner. (1310)

↓

Wirelessly receive sensor data from the teaching substrate, including a top image of the pre-aligner taken by the second camera. (1312)

Wirelessly receive respective top images of the pre-aligner taken from respective positions of the multiple positions by the second camera. (1314)

↓

The plurality of sensors also includes a distance-measuring sensor. Wirelessly receive sensor data from the teaching substrate that includes a distance from the teaching substrate to the pre-aligner, as determined by the distance-measuring sensor with the teaching substrate above the pre-aligner. (1316)

↓

Identify the location of the pre-aligner based at least in part on the top image and/or the distance from the teaching substrate to the pre-aligner. (1318)

Identify the location of the pre-aligner based at least in part on the respective top images and/or the distance from the teaching substrate to the pre-aligner. (1320)

Figure 13

1400
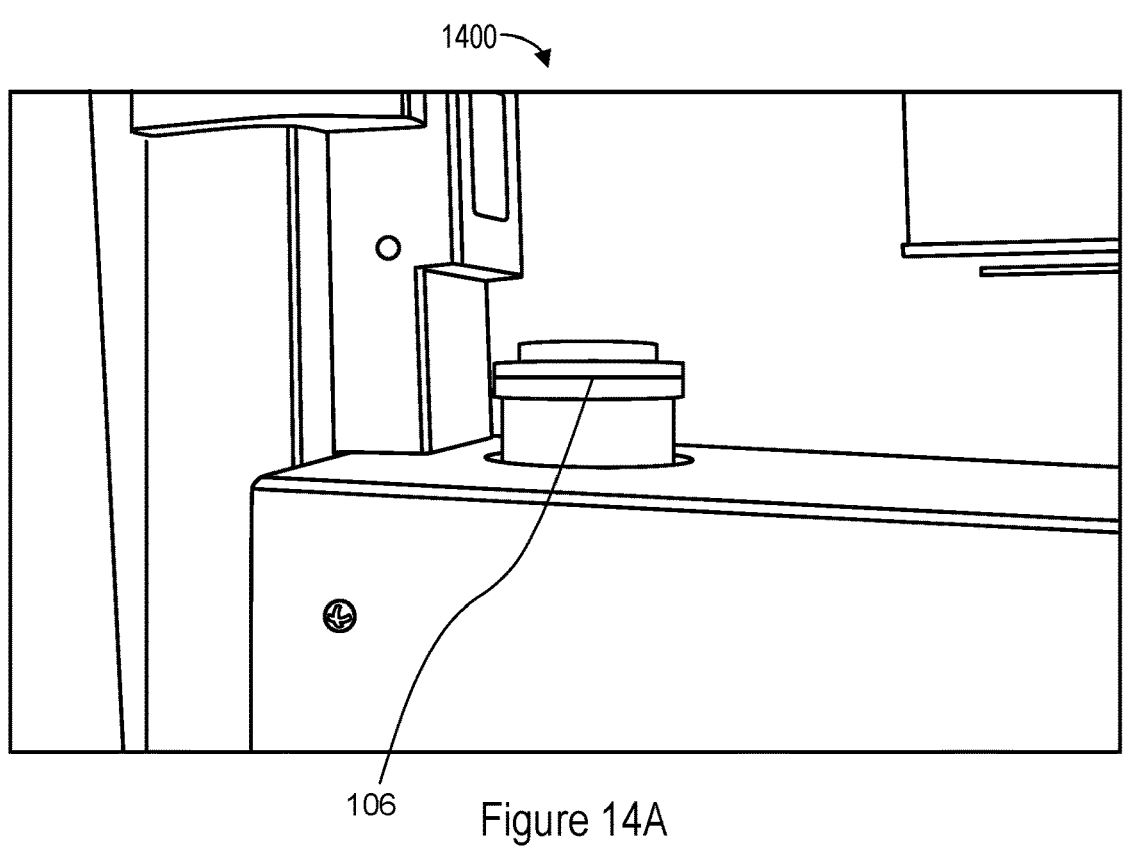
106
Figure 14A
1420
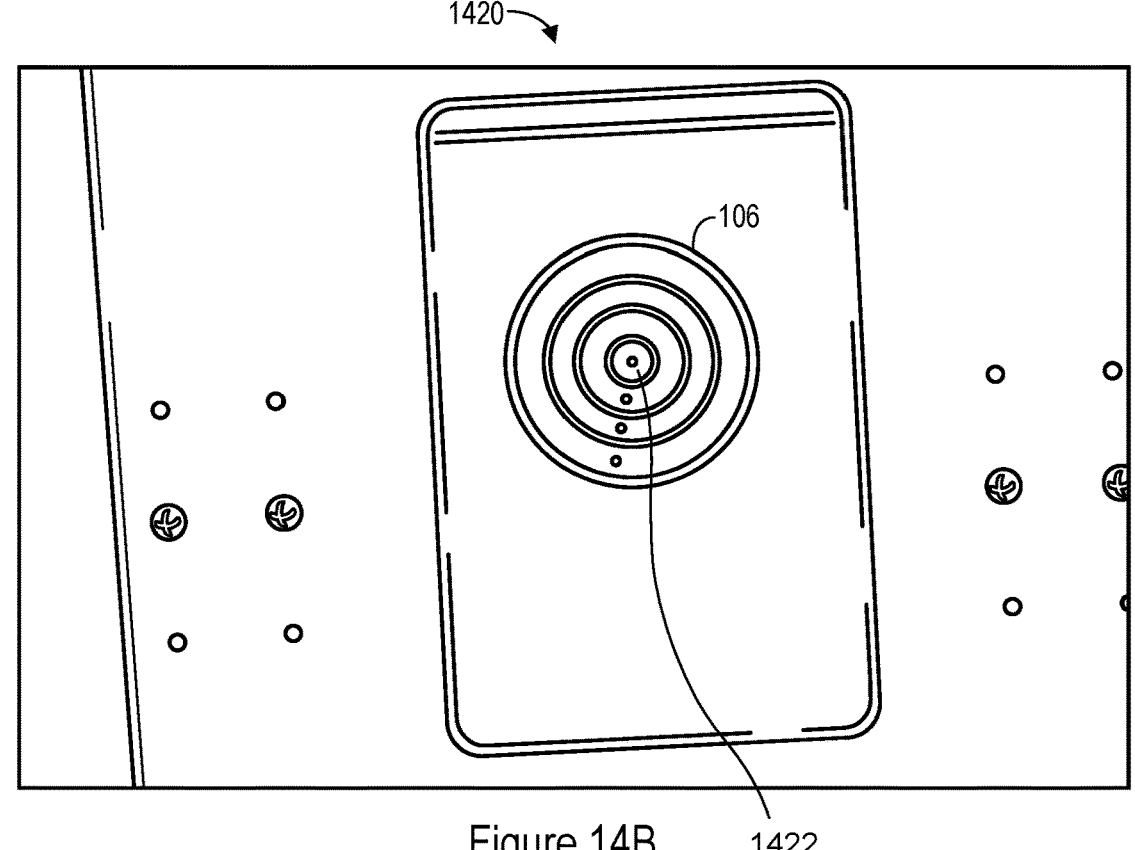
106
Figure 14B        1422

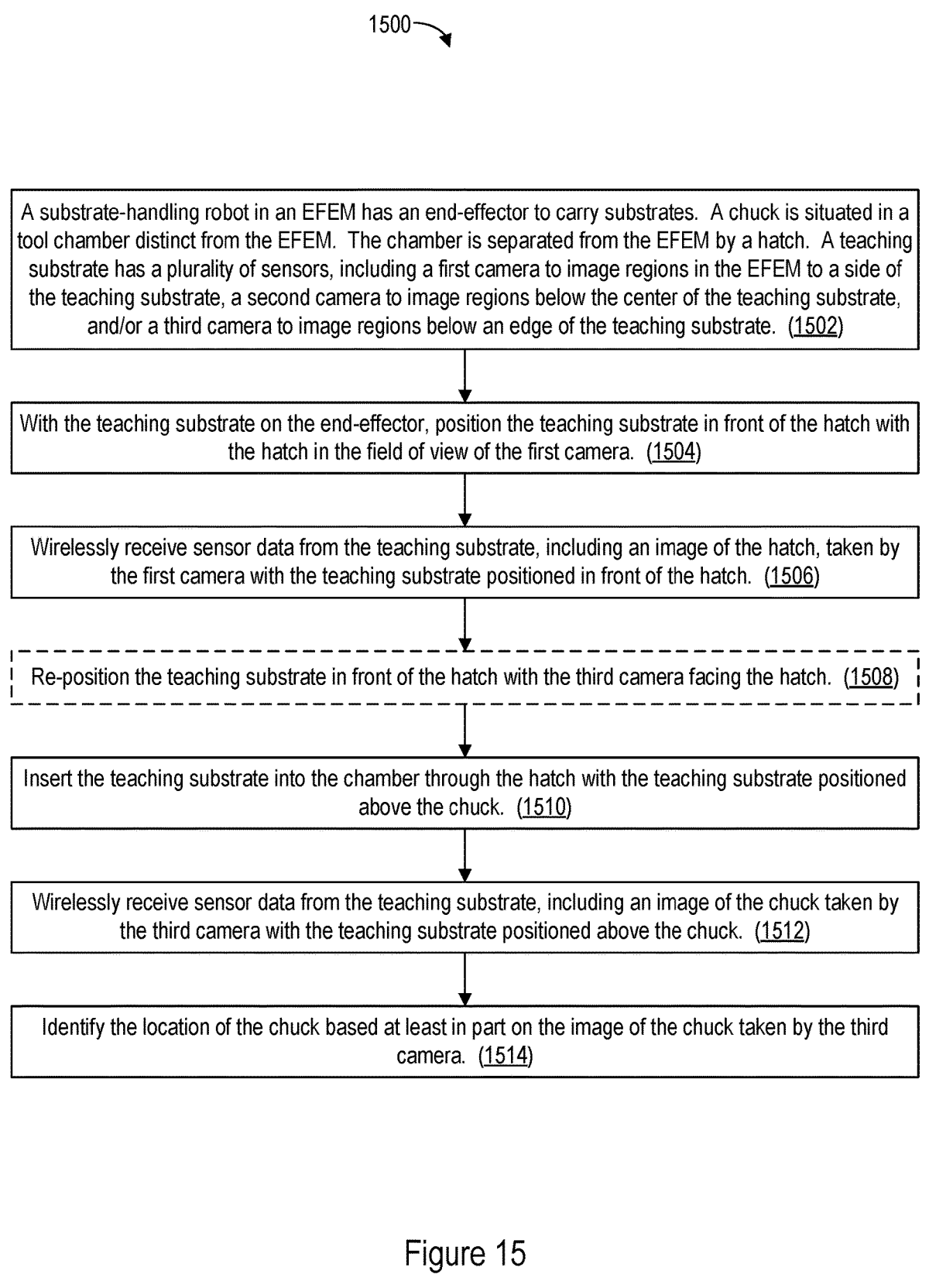

1500 ⟍

A substrate-handling robot in an EFEM has an end-effector to carry substrates. A chuck is situated in a tool chamber distinct from the EFEM. The chamber is separated from the EFEM by a hatch. A teaching substrate has a plurality of sensors, including a first camera to image regions in the EFEM to a side of the teaching substrate, a second camera to image regions below the center of the teaching substrate, and/or a third camera to image regions below an edge of the teaching substrate. (1502)

With the teaching substrate on the end-effector, position the teaching substrate in front of the hatch with the hatch in the field of view of the first camera. (1504)

Wirelessly receive sensor data from the teaching substrate, including an image of the hatch, taken by the first camera with the teaching substrate positioned in front of the hatch. (1506)

Re-position the teaching substrate in front of the hatch with the third camera facing the hatch. (1508)

Insert the teaching substrate into the chamber through the hatch with the teaching substrate positioned above the chuck. (1510)

Wirelessly receive sensor data from the teaching substrate, including an image of the chuck taken by the third camera with the teaching substrate positioned above the chuck. (1512)

Identify the location of the chuck based at least in part on the image of the chuck taken by the third camera. (1514)

Figure 15

1600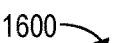

A substrate-handling robot in an EFEM has an end-effector to carry substrates. A chuck is situated in a tool chamber distinct from the EFEM. The chamber is separated from the EFEM by a hatch. A teaching substrate has a plurality of sensors, including a first camera to image regions in the EFEM to a side of the teaching substrate and a distance-measuring sensor facing sideways with respect to the teaching substrate. (1602)

With the teaching substrate on the end-effector, position the teaching substrate in front of the hatch with the hatch in the field of view of the first camera. (1504)

Wirelessly receive sensor data from the teaching substrate, including an image of the hatch, taken by the first camera with the teaching substrate positioned in front of the hatch. (1506)

Re-position the teaching substrate in front of the hatch with the distance-measuring sensor facing the hatch. (1608)

Insert the teaching substrate into the chamber through the hatch. (1610)

Wirelessly receive sensor data from the teaching substrate, including distance measurements taken by the distance-measuring sensor to scan the side of the chuck. (1612)

Identify the location of the chuck based at least in part on the distance measurements. (1614)

The chuck has slots to receive the end-effector. Identify the locations of the slots based at least in part on the distance measurements. (1616)

Teaching-Substrate
Electronic Components
1800
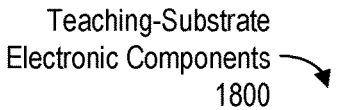
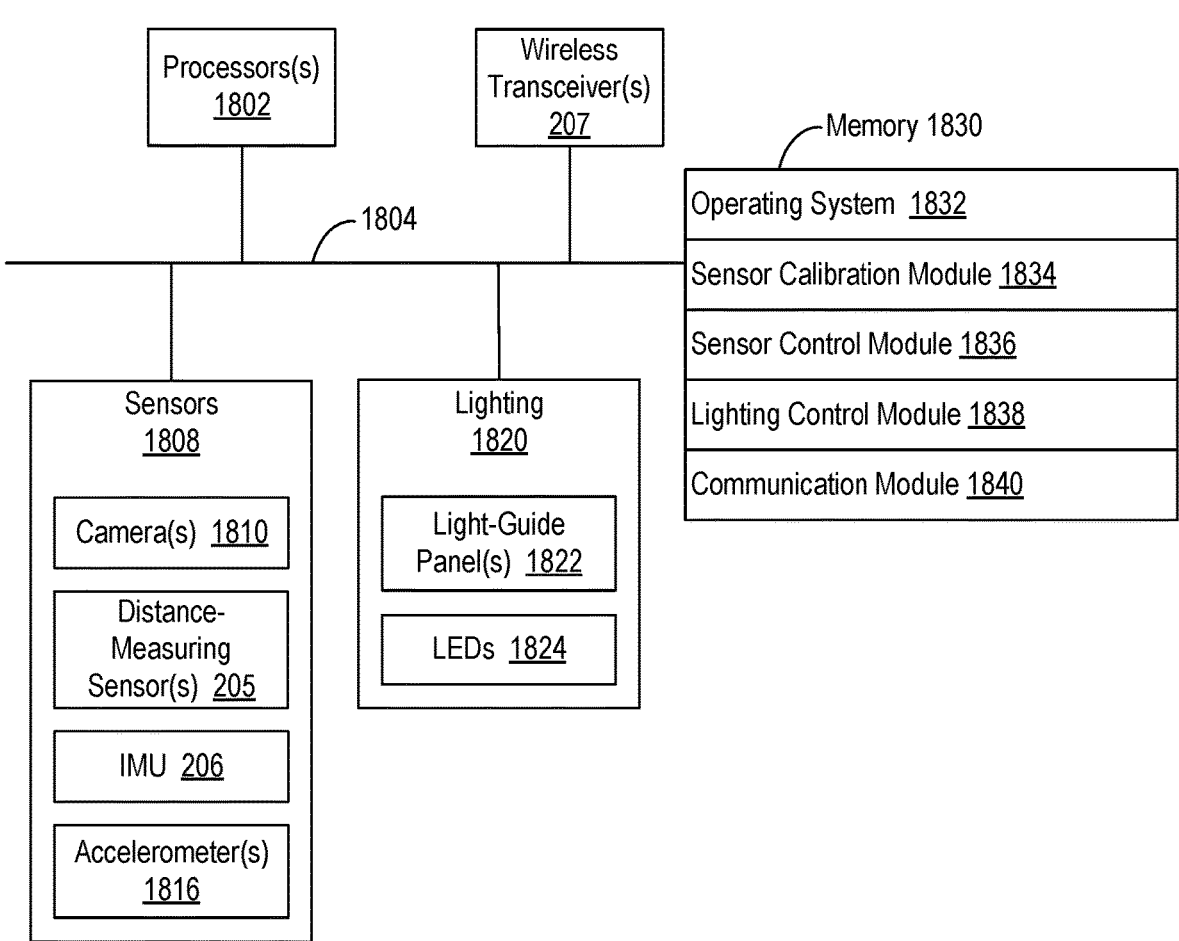
Figure 18

Computer 103

TEACHING SUBSTRATE FOR PRODUCTION AND PROCESS-CONTROL TOOLS

RELATED APPLICATIONS

This application is a divisional of U.S. patent application Ser. No. 17/013,213, filed on Sep. 4, 2020, which claims the benefit of U.S. Provisional Patent Application No. 62/897,545, filed on Sep. 9, 2019, both of which are incorporated by reference in their entirety for all purposes.

TECHNICAL FIELD

This disclosure relates to substrate (e.g., semiconductor-wafer) handling, and more specifically to methods and systems for teaching a substrate-handling robot.

BACKGROUND

A tool for fabricating or inspecting a substrate (e.g., a semiconductor wafer) may include an equipment front-end module (EFEM). The EFEM includes a substrate-handling robot that is used to move substrates between various stations in the tool. As part of installing or modifying the tool, a teaching process is performed to enable the substrate-handling robot to handle substrates (e.g., to accurately and reliably move substrates between stations). Typical teaching processes involve significant tool downtime, which reduces throughput. Also, some steps in typical teaching processes are performed by a technician.

SUMMARY

Accordingly, there is a need for fast, efficient, and accurate automated techniques for teaching a substrate-handling robot.

In some embodiments, an apparatus includes a substrate to be loaded into an equipment front-end module (EFEM) of a fabrication or inspection tool. The apparatus also includes a first camera on the substrate to image regions to a side of the substrate, a second camera on the substrate to image regions below the substrate, and one or more wireless transceivers on the substrate to transmit images captured by the first and second cameras.

In some embodiments, a method includes loading a teaching substrate into a load port of an EFEM of a fabrication or inspection tool. The EFEM includes a substrate-handling robot. The teaching substrate includes a plurality of sensors and one or more wireless transceivers. The tool includes a plurality of stations. With the teaching substrate in the EFEM, the substrate-handling robot moves along an initial route and sensor data are wirelessly received from the teaching substrate. Based at least in part on the sensor data, a modified route distinct from the initial route is determined. The substrate-handling robot moves along the modified route, handling the teaching substrate. Based at least in part on the sensor data, positions of the plurality of stations are determined.

BRIEF DESCRIPTION OF THE DRAWINGS

For a better understanding of the various described implementations, reference should be made to the Detailed Description below, in conjunction with the following drawings.

FIG. 9 is a flowchart showing a method of performing automatic teaching for substrate handling in accordance with some embodiments.

FIG. 10 is a flowchart showing a method of performing automatic teaching for substrate handling in accordance with some embodiments.

FIG. 11 is a flowchart showing a method of performing automatic teaching for substrate handling in a load port, in accordance with some embodiments.

FIG. 13 is a flowchart showing a method of performing automatic teaching for substrate handling for a pre-aligner, in accordance with some embodiments.

FIG. 14A is a side image, taken by a camera on a teaching substrate, of a pre-aligner in accordance with some embodiments.

FIG. 14B is a top image, taken by a camera on a teaching substrate, of a pre-aligner in accordance with some embodiments.

FIG. 15 is a flowchart showing a method of performing automatic teaching for a tool chuck in a tool chamber, in accordance with some embodiments.

FIG. 16 is a flowchart showing an alternate method of performing automatic teaching for a tool chuck in a tool chamber, in accordance with some embodiments.

FIG. 18 is a block diagram of electronic components of a teaching substrate in accordance with some embodiments.

Like reference numerals refer to corresponding parts throughout the drawings and specification.

DETAILED DESCRIPTION

Reference will now be made in detail to various embodiments, examples of which are illustrated in the accompanying drawings. In the following detailed description, numerous specific details are set forth in order to provide a thorough understanding of the various described embodiments. However, it will be apparent to one of ordinary skill in the art that the various described embodiments may be practiced without these specific details. In other instances, well-known methods, procedures, components, circuits, and networks have not been described in detail so as not to unnecessarily obscure aspects of the embodiments.

Figure 1:
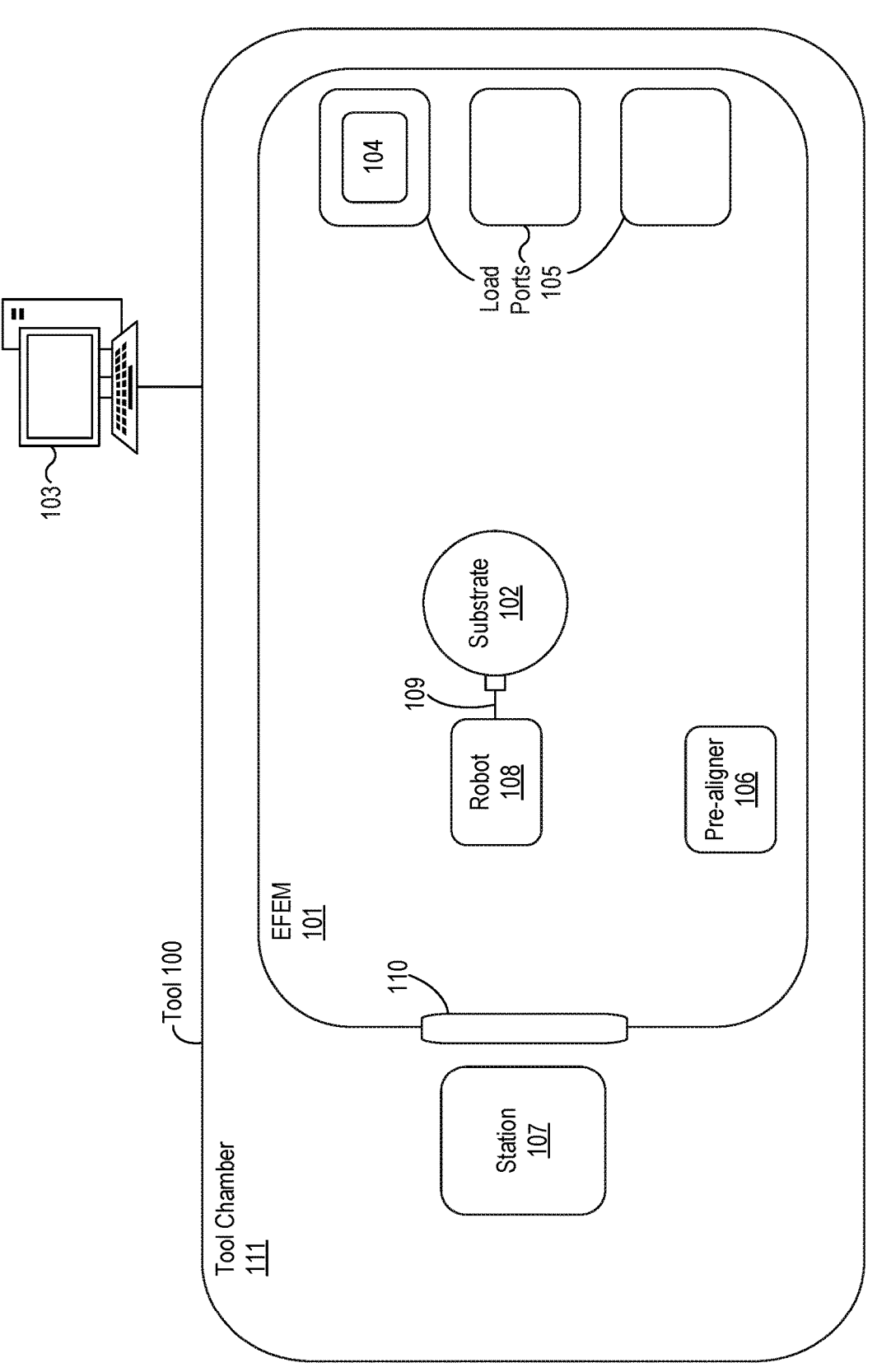
FIG. 1 is a block diagram of a fabrication or inspection tool for fabricating or inspecting substrates.

FIG. 1 is a block diagram of a fabrication or inspection tool 100 for fabricating or inspecting substrates. The tool 100 may also be referred to as a production tool (if it performs substrate fabrication) or a process-control tool (if it performs substrate inspection). The tool 100 includes an equipment front-end module (EFEM) 101 with a substrate-handling robot 108 for handling substrates 102. In some embodiments, the substrates 102 are semiconductor wafers and the tool 100 is a wafer-fabrication or wafer-inspection tool. In some embodiments, the substrates 102 are reticles (i.e., photomasks) and the tool 100 is a reticle-fabrication or reticle-inspection tool. The tool 100 may be used in a substrate-fabrication facility referred to as a fab.

The substrate-handling robot 108 has an end-effector 109 to pick up a substrate 102 and move the substrate 102 through the EFEM 101 between various stations of the tool 100. Examples of stations include, without limitation, load ports 105, a pre-aligner 106, and a station 107 in a tool chamber 111. In some embodiments, the pre-aligner 106 is omitted from the tool 100. The substrate-handling robot 108 has various degrees of freedom; for example, it may rotate, translate, raise, and/or lower a substrate 102 on the end-effector 109. The substrate-handling robot 108 may extend and retract the end-effector 109.

The tool 100 may include one or more load ports 105, which are used to load substrates 102 into the tool 100. Substrates 102 are carried in pods 104 (e.g., are stacked vertically in a pod 104). A pod 104 may also be referred to as a substrate pod, front-opening unified pod (FOUP), cassette, magazine, or boat (e.g., wafer boat). Each pod 104 may contain multiple substrates 102. A pod 104 may be loaded into a load port 105, either manually by a user (e.g., technician or operator) or automatically using robotic equipment (e.g., overhead transportation) in the fab. The substrate-handling robot 108, using the end-effector 109, picks up a substrate 102 from a pod 104 as loaded into a load port 105 and transports the substrate 102 to the pre-aligner 106. The pre-aligner 106 includes a chuck on which the substrate-handling robot 108 places the substrate 102. The pre-aligner 106 rotates the substrate 102 to a specified orientation (e.g., with respect to a notch on the substrate 102). The pre-aligner 106 may notify the substrate-handling robot 108 to correct its position, so that the substrate-handling robot 108 can pick up the substrate 102 in the middle. The substrate-handling robot 108, using the end-effector 109, picks up the substrate 102 from the pre-aligner 106 and moves the substrate 102 to a station 107 in a tool chamber 111. The station 107 includes a chuck. The tool chamber 111 is separated from the EFEM 101 by a hatch 110. The hatch 110 may open and close or may always be open (i.e., may be an opening). The substrate-handling robot 108 inserts the substrate 102 through the hatch 110 and places the substrate 102 on the chuck of the station 107. (In some embodiments, however, a teaching substrate as described below (e.g., teaching substrate 200, FIGS. 2A-2B; 300, FIG. 3; 400, FIG. 4; 500, FIGS. 5A-5B; 2000, FIGS. 20A-20B) is not placed on the chuck of the station 107, to reduce contamination.) The substrate 102 is processed or inspected in the tool chamber 111, and then returned to the pod 104 by reversing the movements used to transfer the substrate 102 to the tool chamber 111. The tool 100 is shown with a single tool chamber 111 and corresponding station 107, but may include multiple tool chambers 111 with respective stations 107, in accordance with some embodiments. For example, the tool 100 may be a cluster tool.

A computer 103, which may be referred to as a front-end computer (FEC), controls the tool 100. For example, the computer 103 controls movement of the substrate-handling robot 108 and the pre-aligner 106, and controls opening and closing of the load ports 105 and the hatch 110. The computer 103 may communicate with the tool 100 through wired and/or wireless connections. While the computer 103 is shown as being separate from and communicatively coupled with the tool 100, it may be included in the tool 100.

An automatic teaching (i.e., training) process is performed to identify the locations of stations in the tool 100 and determine a route for moving substrates 102 through the tool 100. The automatic teaching process may be performed when first installing the tool 100 and after the tool 100 has been modified. For example, the automatic teaching process is performed after new components are installed in the tool 100 that may affect movement of substrates 102 (e.g., that are potential obstacles to movement of the substrates 102). The automatic teaching process is performed using a teaching substrate that is loaded into and moved through the EFEM 101. The teaching substrate has sensors that are used in the automatic teaching process. Data from the sensors is wirelessly transmitted from the teaching substrate to the computer 103. The computer 103 may wirelessly transmit commands to the teaching substrate and the substrate-handling robot 108, which perform the commands. The commands transmitted to the teaching substrate include instructions for the sensors on the teaching substrate. The locations of stations in the tool 100 and the route for moving substrates 102 through the tool 100 are determined based at least in part on the sensor data.

Figure 2A:
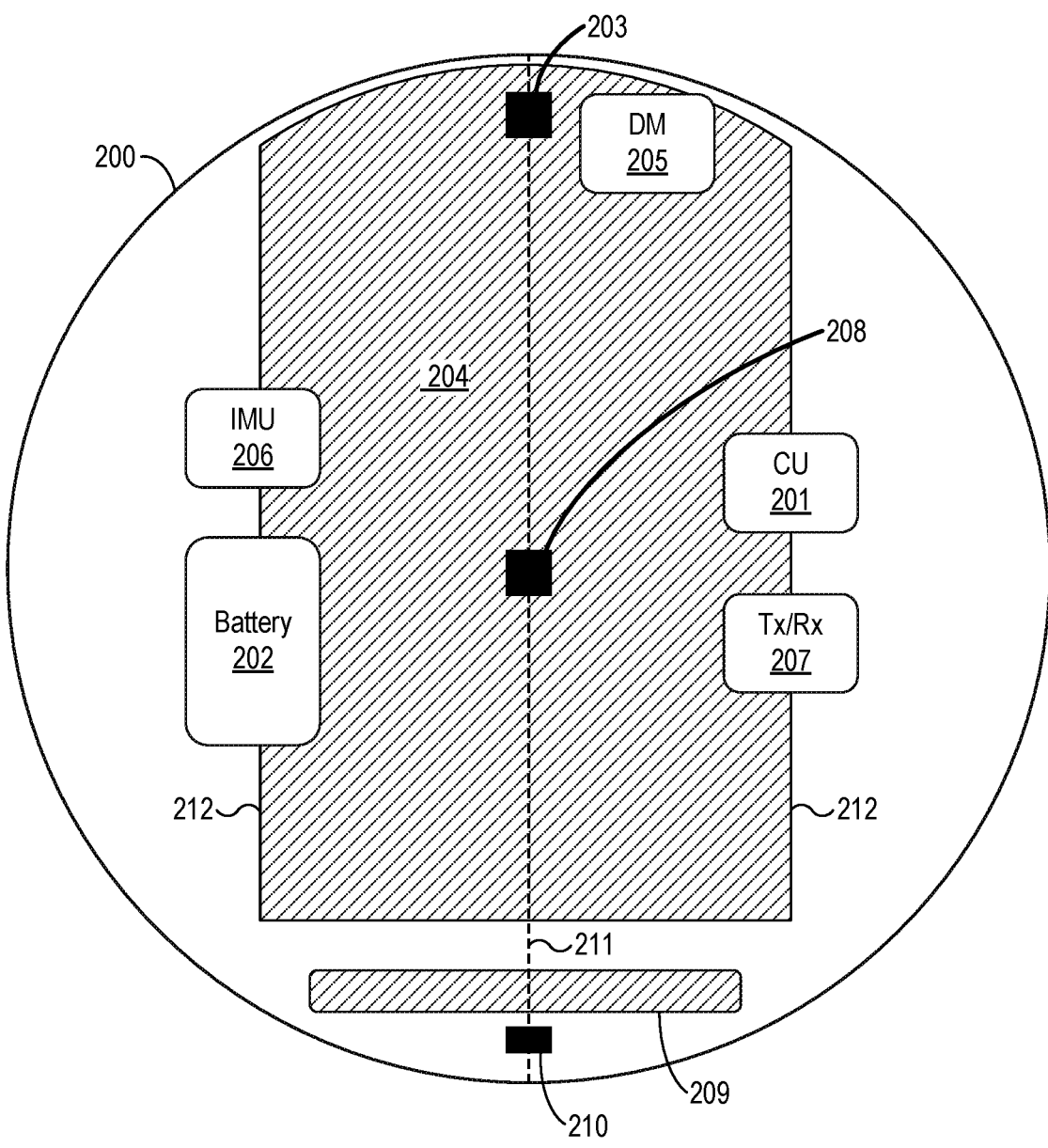
FIG. 2A is a plan view of a teaching substrate, with sensors and light-guide panels, to be used for automatic teaching of substrate handling in a fabrication or inspection tool, in accordance with some embodiments.

FIG. 2A is a plan view of a teaching substrate 200 in accordance with some embodiments. The teaching substrate 200 is sized to be loaded into a tool 100 (FIG. 1), for example by being placed in a pod 104 that is loaded into a load port 105. In some embodiments, the tool 100 is a semiconductor-wafer fabrication or inspection tool and the teaching substrate 200 is shaped like a semiconductor wafer (e.g., is circular with the same diameter as production semiconductor wafers fabricated or inspected using the tool 100, such as 300 mm, 450 mm, 150 mm, 200 mm, etc.). In some embodiments, the tool 100 is a reticle fabrication or inspection tool and the teaching substrate 200 is shaped like a reticle (e.g., is a blank reticle with components on its top surface). The teaching substrate 200 (or other teaching substrates disclosed herein), including its components, may have a weight that differs from production substrates by no more than a specified amount. For example, a teaching substrate may weigh approximately 100 grams (e.g., to within 10% or 5%) more than a production substrate.

The teaching substrate 200 has various sensors, including cameras 203, 208, and 210; a distance-measuring (DM) sensor (i.e., range sensor) 205; and an inertial measurement unit (IMU) 206. (Equivalently, the sensors may be said to be on the teaching substrate 200.) The IMU 206 may include one or more accelerometers. The teaching substrate 200 has other components, including a computational unit (CU) 201 with one or more processors and memory (e.g., processor(s) 1802 and memory 1830, FIG. 18) (e.g., a microcontroller with embedded memory), one or more wireless transceivers (Tx/Rx) 207, light-guide panels 204 and 209, and a battery 202. The battery 202 powers the sensors, computational unit 201, one or more wireless transceivers 207, light-guide panels 204 and 209, and any other electronic components on the teaching substrate 200. The sensors and other components, or a portion thereof, may be situated (e.g., mounted) on the top of the teaching substrate 200, leaving the bottom of the teaching substrate 200 or a portion thereof clear for handling by the end-effector 109 of the substrate-handling robot 108 and for placement on chucks in the tool 100 (FIG. 1).

The teaching substrate 200 has cameras oriented to image regions in the tool 100 (e.g., in the EFEM 101) below the teaching substrate 200. The camera 203, situated at or adjacent to an edge of the teaching substrate 200, can image regions below the edge of the teaching substrate 200 (e.g., regions in a field of view 506, FIGS. 5A-5B). The camera 208, which may be positioned at the center of the teaching substrate 200, can image regions below the center of the teaching substrate 200 (e.g., regions in a field of view 504, FIGS. 5A-5B). In some embodiments, the cameras 203 and 208 are mounted on the top side of the teaching substrate 200 and the teaching substrate 200 is transparent, allowing the cameras 203 and 208 to capture images of regions below the teaching substrate 200 through the teaching substrate 200. Alternatively, the teaching substrate 200 may have respective holes through which the top-mounted cameras 203 and/or 208 capture images of regions below the teaching substrate 200. For example, the teaching substrate 200 has a first hole to provide the camera 208 with a view of regions below the center of the teaching substrate 200 and a second hole to provide the camera 203 with a view of regions below the edge of the teaching substrate 200. In some embodiments, the cameras 203 and/or 208 are downward-facing on the top side of the teaching substrate 200 (i.e., are downward-facing with respect to the teaching substrate 200). Alternatively, the cameras 203 and/or 208 are side-facing on the top side of the teaching substrate 200 and have associated mirrors (e.g., 45° mirrors) (e.g., mirror 2006, FIGS. 20A-20B) that direct respective views of the cameras 203 and/or 208 below the teaching substrate 200.

Figure 5A:
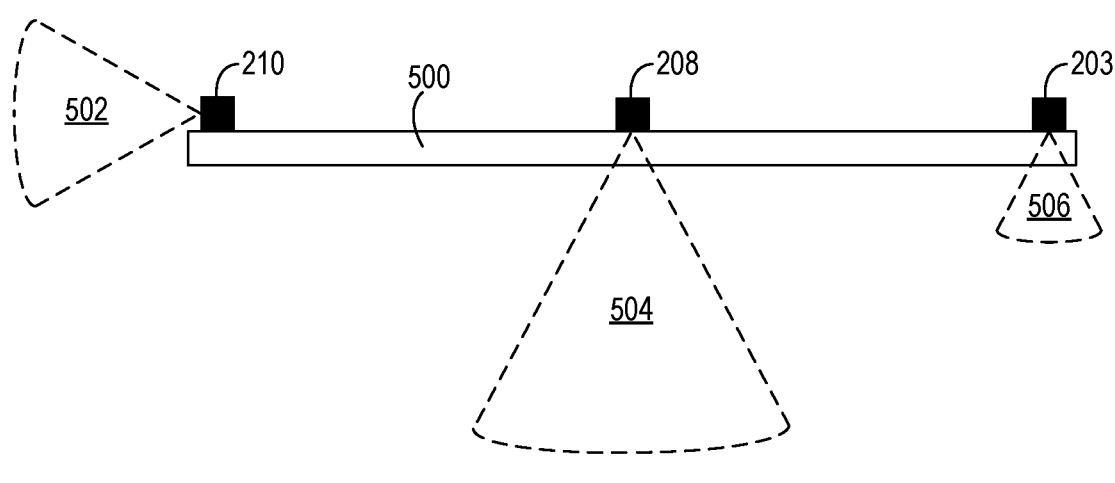
FIGS. 5A and 5B are respective side cross-sectional and plan views of a teaching substrate and the fields of view of cameras on the teaching substrate, in accordance with some embodiments.
Figure 5B:
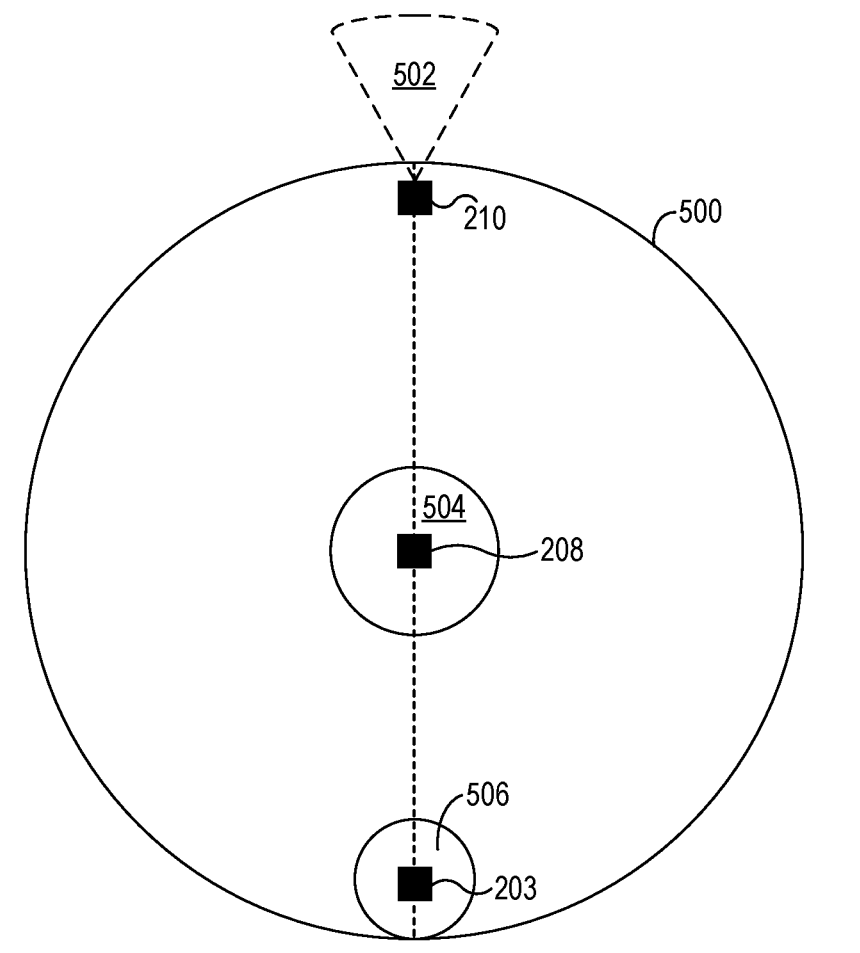

The camera 210 is situated at or adjacent to a side of the teaching substrate 200 (e.g., an edge of the teaching substrate 200 opposite to the edge for the camera 203) and can image regions in the tool 100 (e.g., in the EFEM 101) to the side of the teaching substrate 200 (e.g., regions in a field of view 502, FIGS. 5A-5B). In some embodiments (e.g., some embodiments in which the teaching substrate 200 is wafer-shaped), the cameras 203, 208, and 210 are positioned along a diameter 211 of the teaching substrate 200, with the cameras 203 and 210 on opposite sides of the camera 208. The camera 210 may be situated (e.g., mounted) on the top side of the teaching substrate 200, facing sideways and outward with respect to the teaching substrate 200 so that it has a field of view to the side of the teaching substrate 200.

The light-guide panels 204 and 209 serve as lighting for the cameras 203, 208, and 210. The light-guide panel 204 faces downward with respect to the teaching substrate 200, to illuminate both the regions below the center of the teaching substrate 200 for imaging by the camera 208 and the regions below the edge of the teaching substrate 200 for imaging by the camera 203. For example, the light-guide panel 204 is on the top side of the teaching substrate 200 and faces downward to provide illumination through the teaching substrate 200, which is transparent. Other components (e.g., the computational unit 201, distance-measuring sensor 205, IMU 206, wireless transceiver(s) 207, and/or battery 202) may be at least partially situated above the light-guide panel 204. The light-guide panel 209, which may be located behind the camera 210, faces sideways and outward with respect to the teaching substrate 200, to illuminate the regions to the side of the teaching substrate 200 for imaging by the camera 210. In some embodiments, each of the light-guide panels 204 and 209 contains multiple light-emitting diodes (LEDs). For example, the light-guide panel 204 may contain LEDs along its straight sides 212. The light-guide panel 209 may contain LEDs along respective sides (e.g., the lengthwise edges parallel to the surface of the teaching substrate 200). For each of the light-guide panels 204 and 209, illumination from these LEDs is coupled into light guides and emitted (e.g., homogeneously emitted) through the panel surface.

Figure 2B:
FIG. 2B is a perspective view of an example of the teaching substrate of FIG. 2A, showing light-guide panels and cameras while omitting other components, in accordance with some embodiments.

FIG. 2B is a perspective view of an example of the teaching substrate 200 in accordance with some embodiments. The perspective view of FIG. 2B shows the cameras 203, 208, and 210 and the light-guide panels 204 and 209. Other components of the teaching substrate 200 are omitted, to avoid obscuring portions of the light-guide panels 204 and 209. In the example of FIG. 2B, the camera 210 is mounted behind (i.e., on the back side of) the light-guide panel 209. The light-guide panel 209 may include an aperture (obscured by the camera 210 in FIG. 2B) to provide the camera 210 with a field of view 502 (FIG. 5A-5B) to the side of the teaching substrate 200. Similarly, the cameras 203 and 208 are mounted above (i.e., on the back side of) the light-guide panel 204, which may include apertures (obscured by the cameras 203 and 208 in FIG. 2B) to provide the cameras 203 with fields of view 506 and 504 (FIGS. 5A-5B) below the teaching substrate 200.

Figure 3:
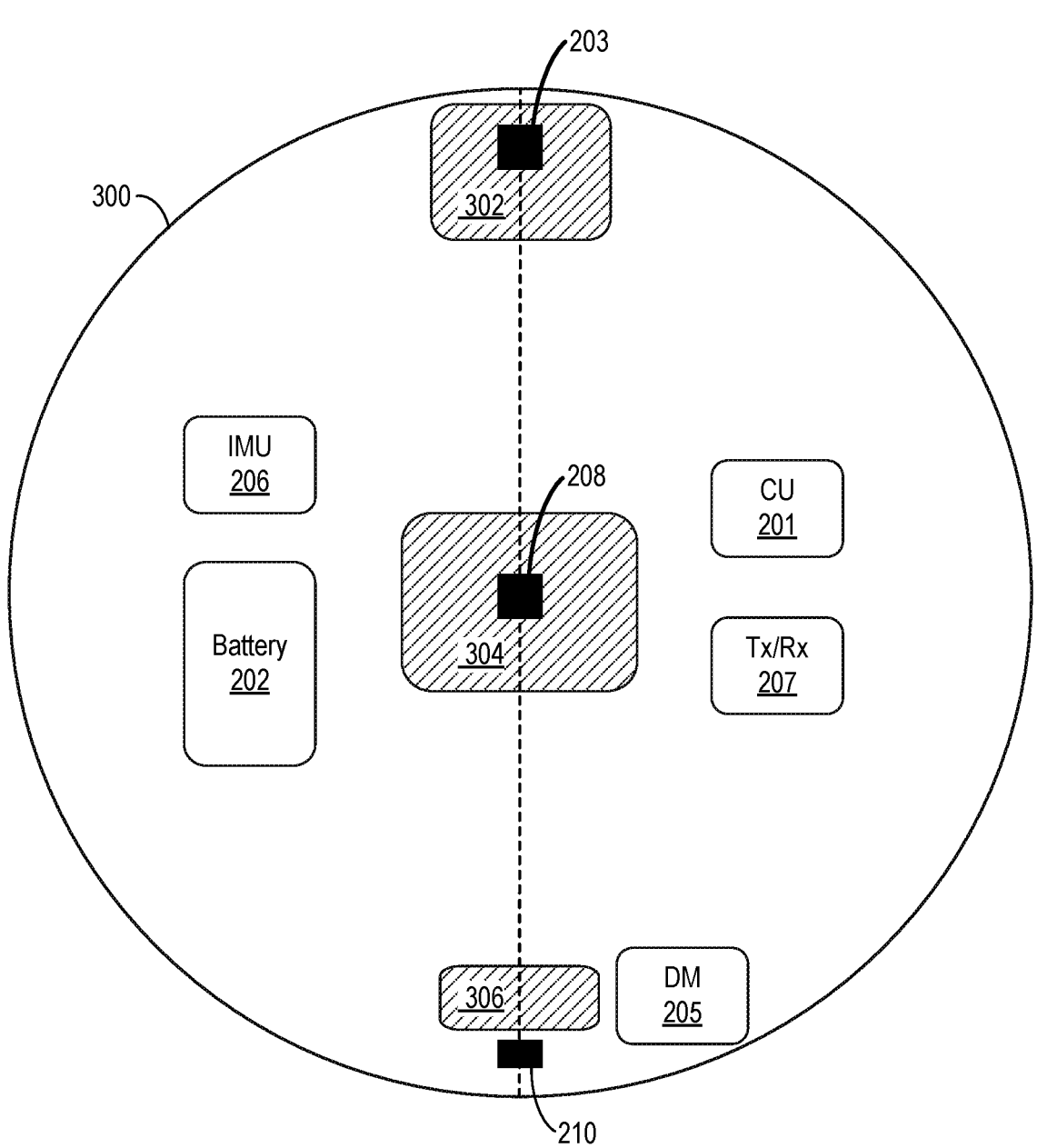
FIG. 3 is a plan view of a teaching substrate with cameras and separate light-guide panels to provide illumination for each of the cameras, in accordance with some embodiments.

The teaching substrate 200 uses a single light-guide panel 204 to provide illumination for the cameras 203 and 208. Alternatively, separate light-guide panels are used to provide illumination for each of the cameras 203 and 208, as shown in FIG. 3 in accordance with some embodiments. FIG. 3 is a plan view of a teaching substrate 300 that includes a light-guide panel 302 for the camera 203, a light-guide panel 304 for the camera 208, and a light-guide panel 306 for the camera 210. The light-guide panel 302 illuminates the field of view 506 (FIGS. 5A-5B) for the camera 203. The light-guide panel 304 illuminates the field of view 504 (FIGS. 5A-5B) for the camera 208. The light-guide panel 306 illuminates the field of view 502 (FIGS. 5A-5B) for the camera 210.

Figure 20A:
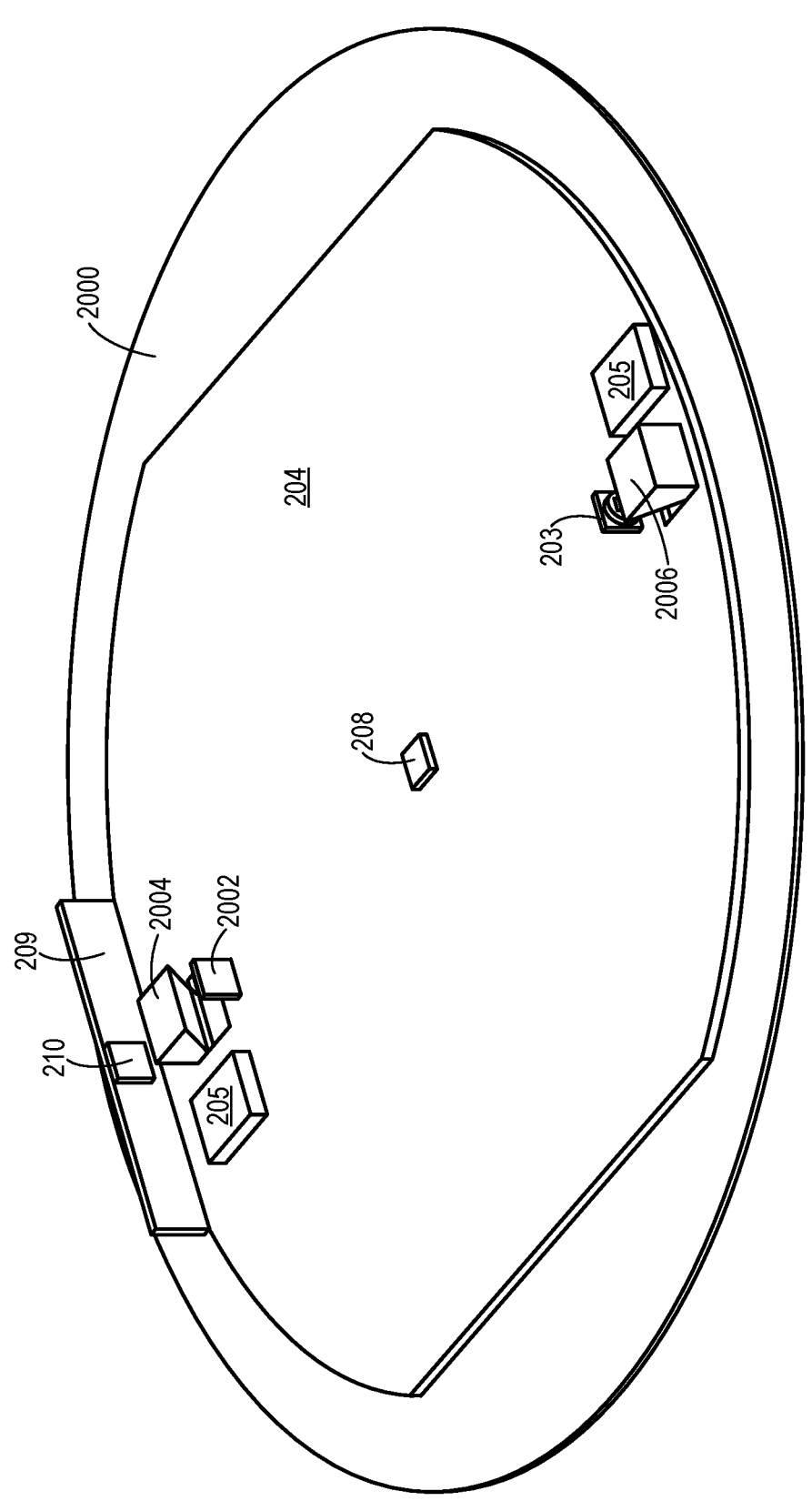
FIGS. 20A and 20B are perspective and plan views, respectively, of a teaching substrate with four cameras, in accordance with some embodiments.
Figure 20B:
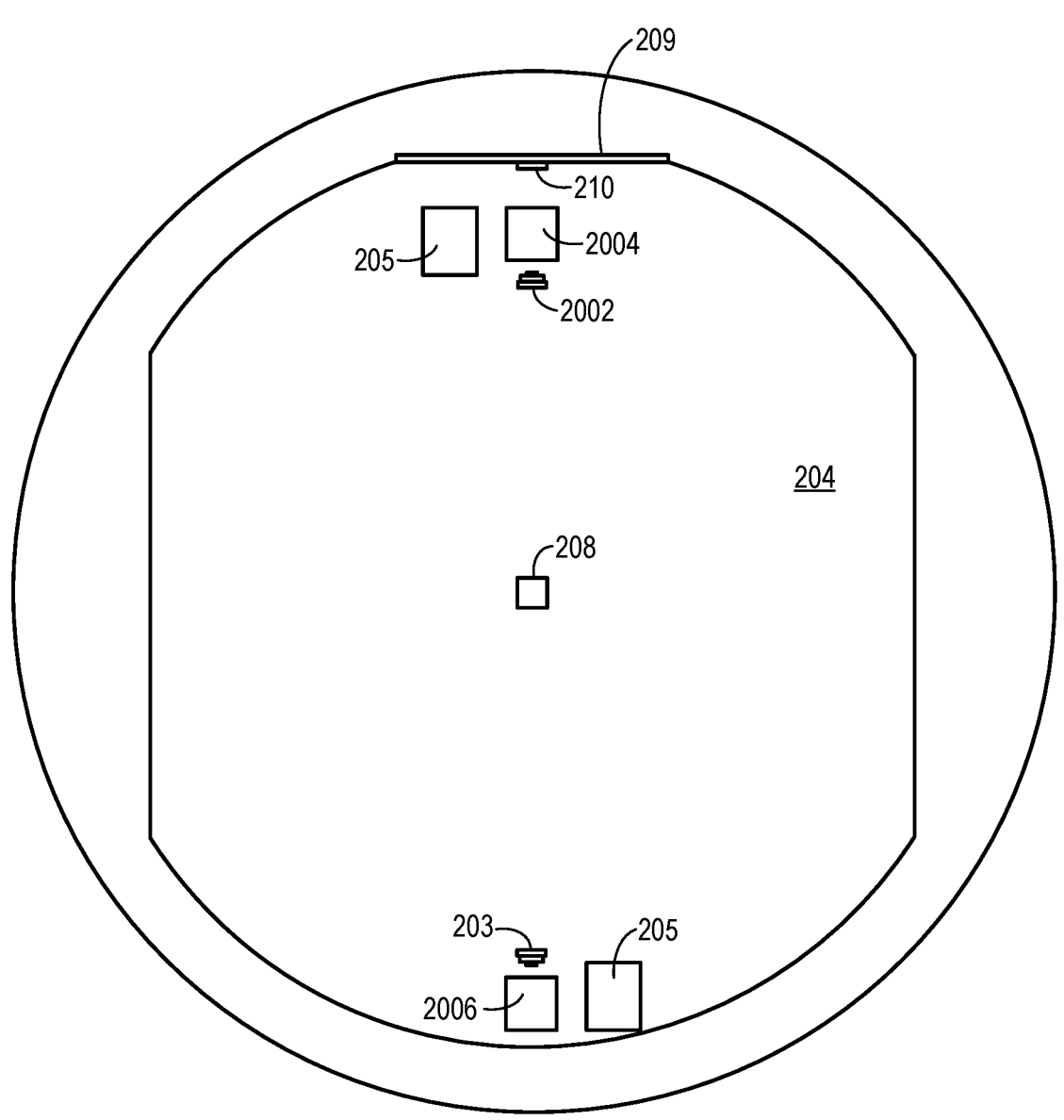

In some embodiments, a teaching substrate includes cameras on different sides (e.g., on opposite sides along a diameter 211) that are oriented to image regions in the tool 100 (e.g., in the EFEM 101) below the teaching substrate 200. FIGS. 20A and 20B are perspective and plan views, respectively, of a teaching substrate 2000 that includes the cameras 203, 208, and 210, and also includes a fourth camera 2002 oriented to image regions below an opposite side of the teaching substrate from the camera 203 (e.g., to image regions below the camera 210). The camera 203 thus may be on an opposite side of the camera 208 from the camera 2002 (e.g., along a diameter of the teaching substrate 2000). The cameras 203 and 2002 are side-facing and have associated mirrors 2006 and 2004, respectively, (e.g., 45° mirrors) that direct respective views of the cameras 203 and 2002 downward below the teaching substrate 200. (Alternatively, the cameras 203 and 2002 may be downward-facing). The camera 208 is downward-facing, in accordance with some embodiments. (Alternatively, the camera 208 may also be side-facing with an associated mirror that directs its view downward below the teaching substrate 200.)

In some embodiments, the teaching substrate 2000 also includes light-guide panels 204 and 209. The light-guide panel 204 provides illumination for the cameras 203, 208, and 2002. (Alternately, each of the cameras 203, 208, and 2002 may have its own light-guide panel, by analogy to FIG. 3, and/or other lighting (e.g., LEDs) may be used.) The light-guide panel 209 (or other lighting, such as LEDs) provides illumination for the camera 210. The teaching substrate 2000 may include distance-measuring sensors 205 (e.g., two distance-measuring sensors 205 adjacent to the mirrors 2004 and 2006 respectively). Other components of the teaching substrate 2000 (e.g., the computational unit 201, IMU 206, wireless transceiver(s) 207, and battery 202) are omitted from FIGS. 20A-20B for clarity.

By including a camera 2002 and distance-measuring sensor 205 on the same side of the teaching substrate 2000 as the camera 210 (e.g., adjacent to the camera 210), downward-facing images and downward distance measurements may be taken for an area that has just been imaged using the camera 210, without first rotating the teaching substrate 2000 using a pre-aligner 106. The teaching substrate 2000 thus may be used in a tool 100 that does not have a pre-aligner 106.

Figure 4:
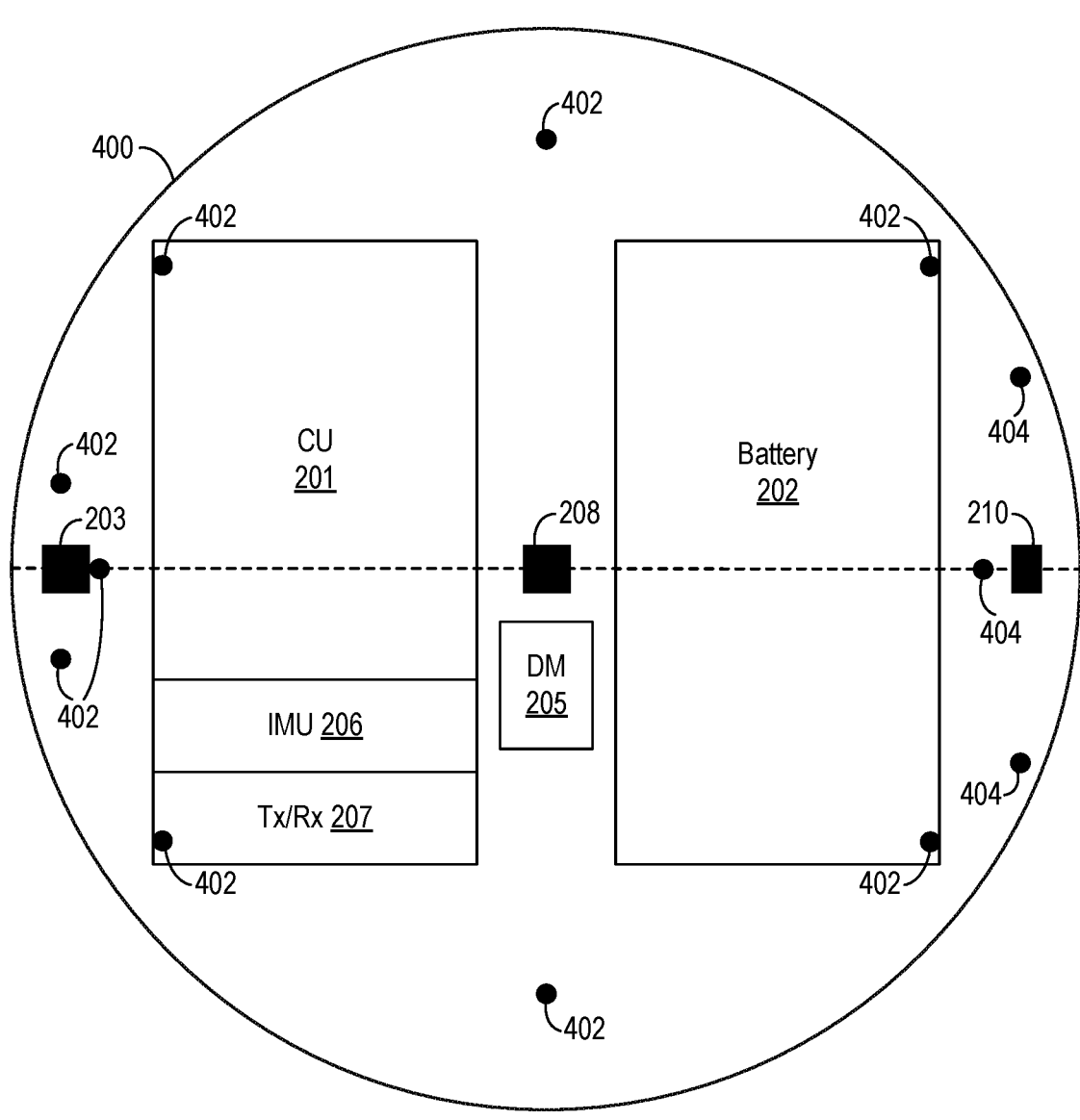
FIG. 4 is a plan view of a teaching substrate with cameras and LEDs to provide illumination for the cameras, in accordance with some embodiments.

In some embodiments, other types of lighting are used instead of or in addition to light-guide panels to provide illumination for the cameras 203, 208, and 210. FIG. 4 is a plan view of a teaching substrate 400 with LEDs to provide this illumination, in accordance with some embodiments. LEDs 402 face downward with respect to the teaching substrate 400 to provide illumination for the cameras 203 and 208 by illuminating regions below the center and edge of the teaching substrate 400 (e.g., to illuminate the fields of view 506 and 504, FIGS. 5A-5B). The teaching substrate 200 may be transparent or may have holes through which light from respective LEDs 402 passes. LEDs 404 face sideways and outward with respect to the teaching substrate 400 to provide illumination for the camera 210 by illuminating regions to the side of the teaching substrate 400 (e.g., to illuminate the field of view 502, FIGS. 5A-5B). In some embodiments, different LEDs 402 face downward at different angles to provide different angles of illumination. Similarly, different LEDs 404 may face outward at different angles to provide different angles of illumination.

In some embodiments, a teaching substrate has a plurality of light sources (e.g., LEDs) and a diffuser to homogenize light from the plurality of light sources. For example, a teaching substrate may have an array of LEDs and a diffuser, disposed between the array and the region to be illuminated, to homogenize light from the array. The homogenized light illuminates the field of view for one or more cameras. For example, the plurality of light sources faces downward and the diffuser is disposed between the plurality of light sources and the top surface of a transparent teaching substrate.

FIGS. 5A and 5B show the respective fields of view 502, 504, and 506 for the cameras 210, 208, and 203, in accordance with some embodiments. FIG. 5A is a side cross-sectional view of a teaching substrate 500, which may be an example of a teaching substrate 200 (FIGS. 2A-2B), 300 (FIG. 3), or 400 (FIG. 4). FIG. 5B is a plan view of the teaching substrate 500. Other components of the teaching substrate 500 are omitted from FIGS. 5A and 5B for clarity.

Returning to FIGS. 2A, 3, and 4, the one or more transceivers 207 of the teaching substrate 200 (FIG. 2A), 300 (FIG. 3) or 400 (FIG. 4) transmit sensor data from the various sensors on the teaching substrate 200 to the computer 103 (FIG. 1) and receive commands from the computer 103. The one or more transceivers 207 provide the commands to the computational unit 201, which executes the commands (e.g., causes respective sensors to perform operations specified by the commands). The sensor data includes images from the cameras 203, 208, and/or 210; distance measurements from the distance-measuring sensor(s) 205; and/or movement measurements from the IMU 206 (e.g., acceleration measurements from one or more accelerometers in the IMU 206). In some embodiments, the one or more wireless transceivers 207 include a transceiver for a wireless local-area network (WLAN) and/or a transceiver for a personal-area network (PAN). For example, the one or more wireless transceivers 207 include a WiFi transceiver and/or a Bluetooth receiver. WiFi provides higher bandwidth than Bluetooth and thus more efficient transmission of sensor data. But fabs may limit the use of WiFi, in which case Bluetooth or another PAN protocol may be used.

In some embodiments, the distance-measuring sensor 205 faces downward with respect to the teaching substrate (e.g., teaching substrate 200, FIG. 2A; 300, FIG. 3; 400, FIG. 4; 2000, FIGS. 20A-20B), to measure distances (e.g., axial distances) to surfaces below the teaching substrate (e.g., surfaces below and parallel to the teaching substrate). In some embodiments, the distance-measuring sensor 205 faces sideways and outward with respect to the teaching substrate (e.g., teaching substrate 200, FIG. 2A; 300, FIG. 3; 400, FIG. 4; 2000, FIGS. 20A-20B), to measure distances to surfaces beside the teaching substrate. In some embodiments, the teaching substrate includes both a downward-facing distance-measuring sensor 205 and a sideways-, outward-facing distance-measuring sensor 205.

Figure 6:
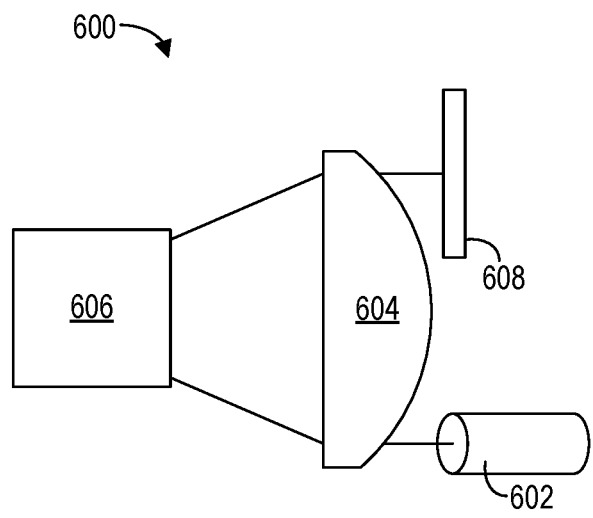
FIG. 6 is an optical diagram of a triangulator that may be used as a distance-measuring sensor on a teaching substrate, in accordance with some embodiments.

The distance-measuring sensor 205 may be (or include) a triangulator. FIG. 6 is an optical diagram of a triangulator 600 that may be used as the distance-measuring sensor 205, in accordance with some embodiments. The triangulator includes a collimated-light source (e.g., laser) 602, a cylindrical lens 604 (or alternatively a spherical lens or Fresnel lens), a folding mirror (i.e., tilted mirror) 606 (e.g., a 45° mirror), and a segmented photodiode 608 (e.g., a bi-cell or quad-cell photodiode). A collimated beam of light from the collimated-light source 602 is focused by the cylindrical lens 604 and folded (i.e., directed) downward (out of the plane of the page of FIG. 6) by the folding mirror 606 toward a surface. The surface reflects the beam, which is folded back into the plane of the page of FIG. 6 by the folding mirror 606 and directed by the cylindrical lens 604 to the segmented photodiode 608. The segmented photodiode 608 is positioned such that each cell of the segmented photodiode 608 receives light of equal intensity if the optical distance from the cylindrical lens 604 to the surface equals the focal distance for the cylindrical lens 604 (i.e., the surface is in the focal plane). If the surface is at a different distance, each cell of the segmented photodiode 608 receives light of a different intensity from the other cell(s). Using the intensity ratio(s) between the cells and calibration data for the triangulator 600, the distance to the surface may be determined.

Figure 7:
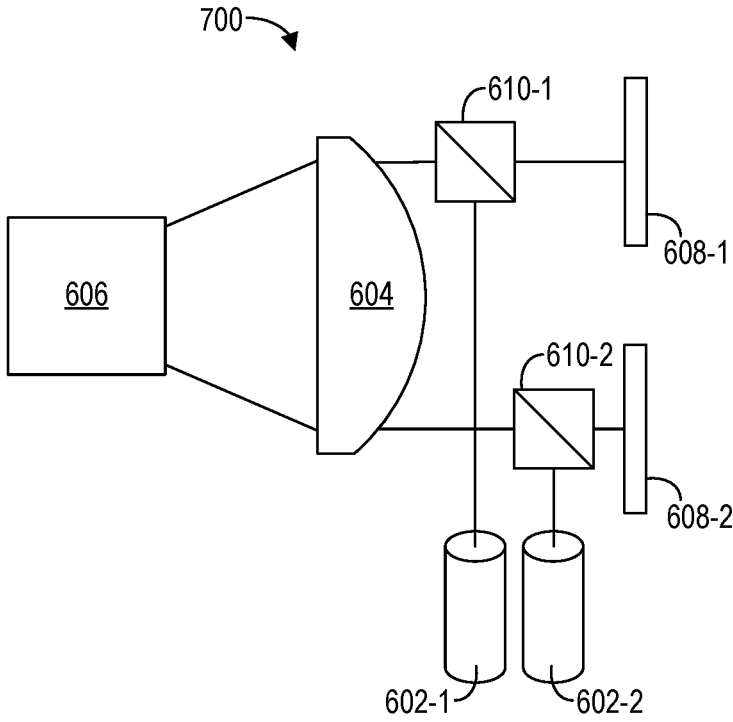
FIG. 7 is an optical diagram of a triangulator with tilt cancellation that may be used as a distance-measuring sensor on a teaching substrate, in accordance with some embodiments.

FIG. 7 is an optical diagram of a triangulator 700 that may be used as the distance-measuring sensor 205, in accordance with some embodiments. While measurements taken with the triangulator 600 may be affected by tilt of the surface with respect to the teaching substrate, the triangulator 700 allows the effect of tilt to be canceled. The triangulator 700 includes the cylindrical lens 604 (or alternatively a spherical lens or Fresnel lens) and the folding mirror 606 (e.g., a 45° mirror). The triangulator 700 also includes two collimated-light sources (e.g., lasers) 602-1 and 602-2, a pair of beam splitters 610-1 and 610-2, and a pair of segmented photodiodes 608-1 and 608-2 (e.g., bi-cell or quad-cell photodiodes). The collimated-light sources 602-1 and 602-2 produce respective collimated beams of light, which are reflected by the beam splitters 610-1 and 610-2 toward the cylindrical lens 604. The beams are focused by the cylindrical lens 604 and folded downward by the folding mirror 606 toward a surface. The surface reflects the beams, which are folded back into the plane of the page of FIG. 7 by the folding mirror 606 and directed by the cylindrical lens 604 to the beam splitters 610-2 and 610-1, which provide (e.g., transmit) the respective reflected beams to the segmented photodiodes 608-2 and 608-1. The beam from the collimated light source 602-1 is initially reflected by the beam splitter 610-1 and, after being reflected by the surface, is provided by the beam splitter 610-2 to the segmented photodiode 608-2. The beam from the collimated light source 602-2 is initially reflected by the beam splitter 610-2 and, after being reflected by the surface, is provided by the beam splitter 610-1 to the segmented photodiode 608-1. The segmented photodiodes 608-1 and 608-2 are used to measure distance, as described for FIG. 6. If the surface is tilted, however, the distances measured by the segmented photodiodes 608-1 and 608-2 will differ. Because the triangulator 700 directs the beams onto the surface from opposite directions, the tilt has opposite effects on the distances on measured by the segmented photodiodes 608-1 and 608-2. The triangulator 700 thus allows the effect of tilt to be canceled, resulting in a more accurate distance measurement.

Figure 8:
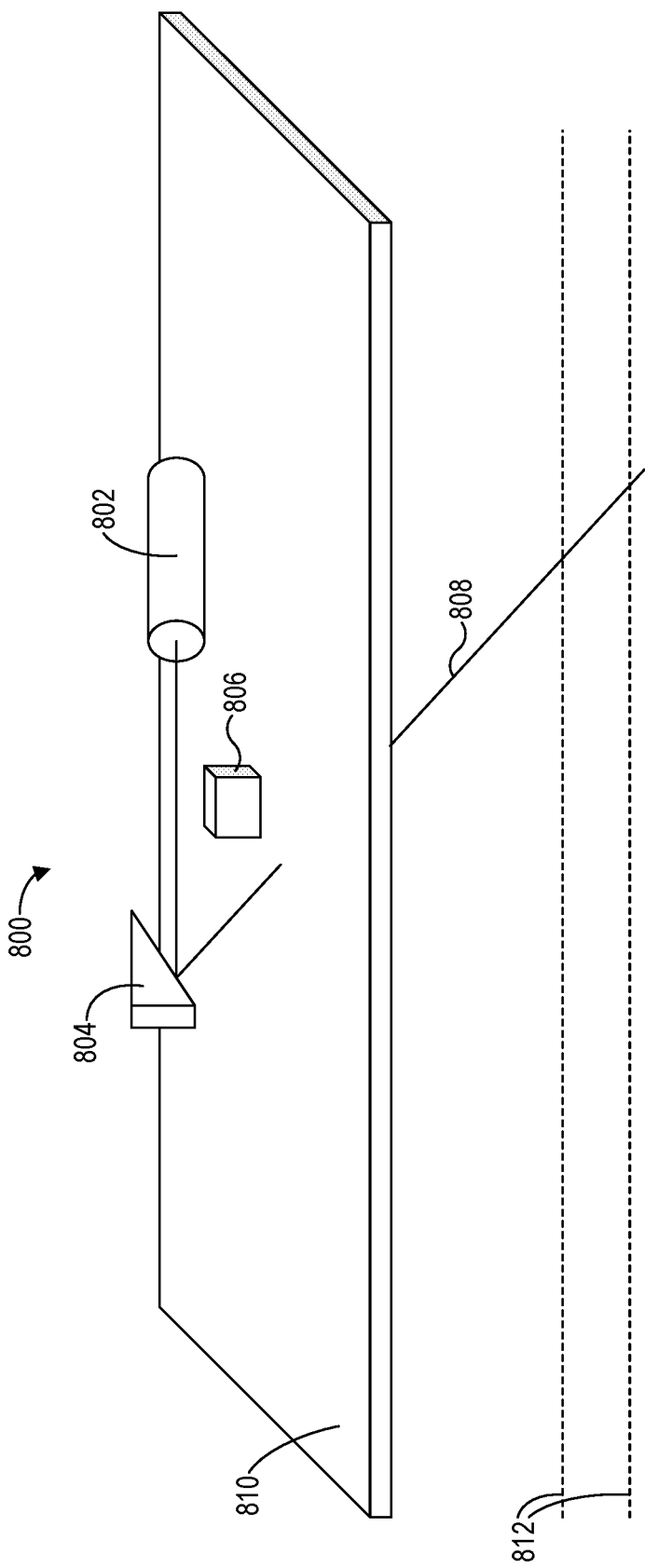
FIG. 8 is an optical diagram of a triangulator that includes a camera and that may be used as a distance-measuring sensor on a teaching substrate, in accordance with some embodiments.

FIG. 8 is an optical diagram of a triangulator 800 that may be used as the distance-measuring sensor 205, in accordance with some embodiments. The triangulator 800 includes a collimated light source (e.g., laser) 802, folding (i.e., tilted) mirror 804, and imager 806 on a top surface 810 of a teaching substrate. In some embodiments, the imager 806 is a camera or a combination of a lens and segmented photodiode (e.g., a bi-cell or quad-cell photodiode). The collimated light source 802 generates a collimated beam of light 808. The folding mirror 804 directs the beam 808 downward and to the side at a known angle (e.g., oblique angle) through the teaching substrate, which may be transparent or have a hole to allow passage of the beam 808. The beam 808 is incident on a surface 812. The imager 806 captures an image showing the location at which the beam 808 is incident on the surface 812 (i.e., the location of the spot for the beam 808 on the surface 812). The distance (e.g., axial distance) from the imager 806 to the surface 812 is determined according to the location of the spot in the image, the field of view of the imager 806, and the angle of the collimated beam of light 808 (as reflected by the folding mirror 804) with respect to the axis of the imager 806. In some embodiments, the imager 806 is the camera 203 or 208, such that the same camera is used to capture image data and take distance measurements. Alternatively, the imager 806 is distinct from the cameras 203 and 208 (e.g., such that it is only used to take distance measurements).

In some embodiments, a triangulator used as or in a distance-measuring sensor 205 differs from the triangulators 600, 700, and 800 (FIGS. 6-8). For example, a commercially-available (e.g., off-the-shelf) triangulator may be used.

In some embodiments, instead of a triangulator, the distance-measuring sensor 205 includes a structured-light projector and a camera. The structured-light projector projects a structured-light pattern onto surfaces in the tool 100 (e.g., in the EFEM 101) and the camera captures images of the surfaces as illuminated by the structured-light pattern. Based on the images and the structured-light pattern, distances to surfaces and/or surface tilts are determined.

Other examples of distance-measuring sensors 205 include a pair of cameras that perform two-camera triangulation, capacitive proximity sensors, and ultrasonic range sensors. The IMU 206 (FIGS. 2A, 3, and 4) may be used as a distance-measuring sensor 205 by estimating the distance an arm of the substrate-handling robot 108 travels before it impacts a surface (e.g. wall), with the impact being a sudden deceleration detected by an accelerometer in the IMU 206. One or more distance-measuring sensors 205 may be used to generate a depth map, which indicates tilt of the surface being mapped.

In some embodiments, a distance-measuring sensor 205 (FIGS. 2A, 3, and 4) (e.g., a triangulator 600, FIG. 6; 700, FIG. 7; or 800, FIG. 8) is used to measure the tilt of a surface with respect to the teaching substrate. The wafer-handling robot 108 (FIG. 1) positions the teaching substrate, and thus the distance-measuring sensor 205, at three or more different horizontal positions above the surface in turn. The distance-measuring sensor 205 measures the distance to the surface from each position. These measurements are sufficient to define a plane of the surface, and the tilt angles (e.g., pitch and roll) are extracted accordingly.

Figure 19:
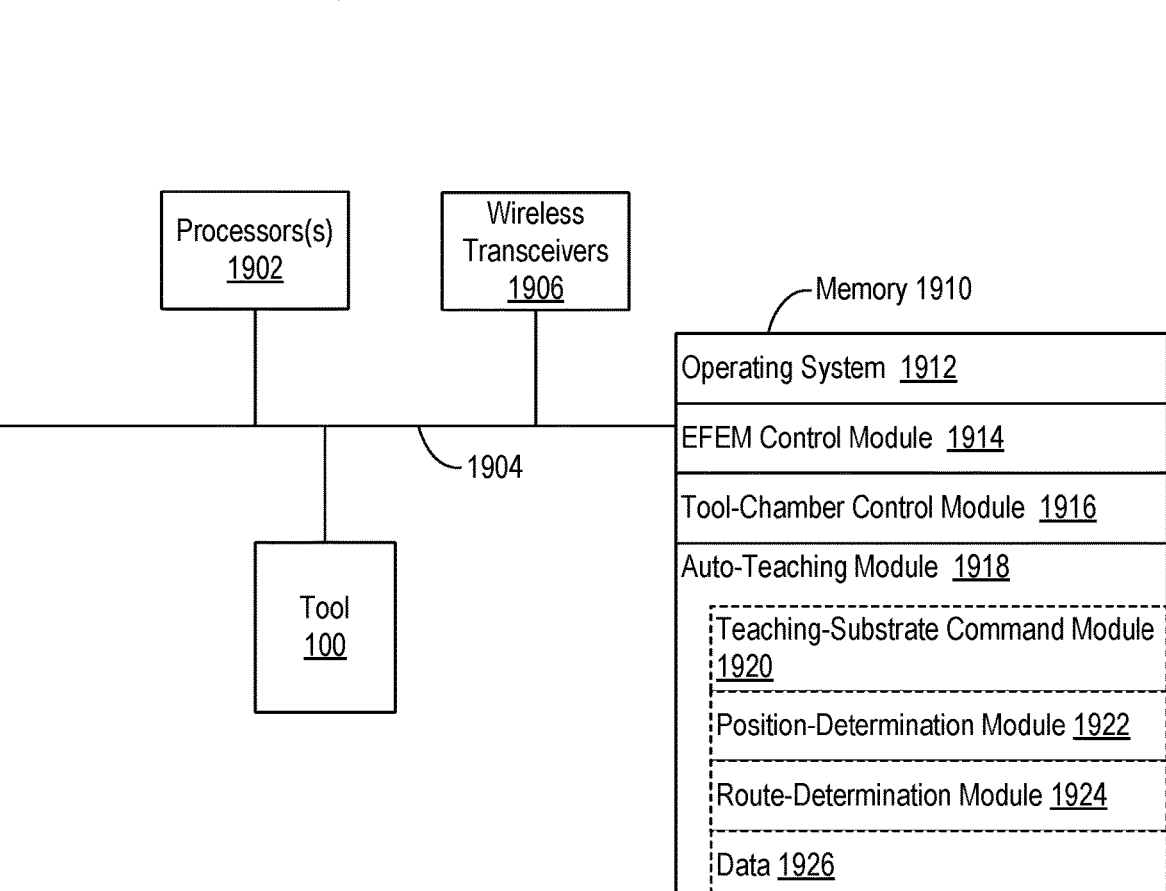
FIG. 19 is a block diagram of a computer that is communicatively coupled to (e.g., is part of) a fabrication or inspection tool in accordance with some embodiments.

FIG. 9 is a flowchart showing a method 900 of performing automatic teaching for substrate handling in accordance with some embodiments. The method 900 may be performed by the computer 103 (FIGS. 1 and 19). The method 900 is performed, for example, when first installing a processing or inspection tool 100 (FIG. 1) and after the tool 100 has been modified (e.g., after new components are installed in the tool 100 that may affect movement of substrates 102).

In the method 900, data is obtained (902) for auto-teaching of a substrate-handling robot 108 in a tool 100 (FIG. 1). The data may include nominal teach positions 904; EFEM positions, specifications, and limitations 906; and calibration data 908 for a teaching substrate (e.g., teaching substrate 200, FIGS. 2A-2B; 300, FIG. 3; 400, FIG. 4; 500, FIGS. 5A-5B; 2000, FIGS. 20A-20B). The nominal teach positions 904 may include nominal positions at which the substrate-handling robot 108 is to pick up substrates from and place substrates on various stations in the tool 100. The nominal teach positions 904 and EFEM positions, specifications, and limitations 906 may be specified according to the design of the tool 100 and may be stored in and obtained from the memory 1910 (FIG. 19) of the computer 103. The calibration data 908 may be obtained wirelessly from the teaching substrate. Using the obtained data, an initial route is planned (910) for the substrate-handling robot 108. Commands corresponding to the initial route are determined for the EFEM 101 and teaching substrate and sent (912) to the EFEM 101 and teaching substrate, respectively. The EFEM 101 performs (914) its commands. The teaching substrate records (914) data, including sensor data, in accordance with its commands.

Data are received (916) from the teaching substrate and EFEM 101. The received data include sensor data from the teaching substrate. The data are analyzed (918) and the planned route is modified (i.e., updated) accordingly.

It is determined (920) whether the auto-teaching for a current station is complete. If it is not (920—No), the method returns to step 912, with additional commands being sent to the EFEM 101 and teaching substrate (e.g., in accordance with the modified route). If it is (920—Yes), the teach position for the current station is updated (922). The teach position will become the position used by the substrate-handling robot 108 during production, once the method 900 is complete. In some embodiments, the teach position is determined in terms of the coordinate axes of the substrate-handling robot 108.

It is determined (924) whether the auto-teaching is complete for all stations. If it is not (924—No), the next station is selected (926) for auto-teaching and the method 900 returns to step 912, with additional commands being sent to the EFEM 101 and teaching substrate. If it is, (924—Yes), the teaching substrate is returned (928) to the pod 104 (FIG. 1) that was used to load the teaching substrate into the EFEM 101 through a load port 105, and the method 900 ends. The teaching substrate (i.e., the pod 104 containing the teaching substrate) may now be unloaded from the load port 105, and the tool 100 may be used for production (e.g., may be used to fabricate or inspect production substrates).

FIG. 10 is a flowchart showing a method 1000 of performing automatic teaching for substrate handling in accordance with some embodiments. The method 1000 may be an example of the method 900 or a portion thereof. The method 1000 may be performed by the computer 103 (FIGS. 1 and 19).

In the method 1000, a teaching substrate (e.g., teaching substrate 200, FIGS. 2A-2B; 300, FIG. 3; 400, FIG. 4; 500, FIGS. 5A-5B; 2000, FIGS. 20A-20B) is loaded (1002) into a load port 105 of an EFEM 101 of a tool 100 (FIG. 1). The EFEM 101 includes a substrate-handling robot 108. A plurality of sensors and one or more wireless transceivers 207 (FIGS. 2A, 3, 4) are on the teaching substrate (i.e., the teaching substrate includes the plurality of sensors and one or more wireless transceivers 207). The tool 100 includes a plurality of stations. In some embodiments, the plurality of sensors includes (1004) a first camera 210 to image regions in the EFEM to a side of the teaching substrate, a second camera (e.g., camera 208) to image regions in the EFEM below the teaching substrate (e.g., below the center of the teaching substrate), a third camera 203 to image regions in the equipment front-end module below an edge of the teaching substrate, one or more distance-measuring sensors 205 facing downward and/or sideways with respect to the teaching substrate, an IMU 206, and/or one or more accelerometers (which may be part of the IMU 206). In some embodiments, a pod 104 containing the teaching substrate is loaded into the load port 105. The teaching substrate is oriented in the pod 104 such that a respective sensor (e.g., the first camera 210) faces in a desired direction.

With the teaching substrate in the EFEM 101, the substrate-handling robot 108 moves (1006) along an initial route. The initial route may be the initial route planned in step 910 of the method 900, and the substrate-handling robot 108 may move along the initial route in response to commands sent in step 912 of the method 900 (FIG. 9).

With the teaching substrate in the EFEM 101, sensor data is wirelessly received (1008) from the teaching substrate (e.g., as in step 916 of the method 900, FIG. 9). In some embodiments, the sensor data includes one or more images taken with the first camera 210, one or more images taken with the second camera (e.g., camera 208), one or more images taken with the third camera 203, one or more distances determined by the distance-measuring sensor(s) 205 (e.g., axial distances to a surface below the teaching substrate) (e.g., distances to objects beside the teaching substrate), data (e.g., movement measurements) from the IMU 206, and/or data (e.g., acceleration measurements) from one or more accelerometers. The movement measurements may include the acceleration measurements or a portion thereof. The sensor data may be acquired while the substrate-handling robot 108 is moving along the initial route, once the substrate-handling robot 108 has reach a specified position, and/or with the substrate-handling robot 108 at multiple specified positions.

Based at least in part on the sensor data, a modified route is determined (1010) (e.g., as in step 918 of the method 900, FIG. 9). The modified route is distinct from the initial route. The substrate-handling robot 108 moves (1012) along the modified route (e.g., in response to commands sent in an iteration of step 912 of the method 900, FIG. 9). Moving the substrate-handling robot 108 includes handling the teaching substrate with the substrate-handling robot 108. For example, moving the substrate-handling robot 108 includes picking up the teaching substrate using the end-effector 109 and/or moving the teaching substrate as loaded onto the end-effector 109.

Based at least in part on the sensor data, positions of the plurality of stations are determined (1014) (e.g., in accordance with step 922 of the method 900, FIG. 9). In some embodiments, the determined positions include teach positions for the substrate-handling robot 108, to be used by the substrate-handling robot 108 during production to delivery and retrieve production substrates to respective stations of the plurality of stations. In some embodiments, the positions are determined in terms of the coordinate axes of the substrate-handling robot 108. A production route through the EFEM 101 is determined (1016), based at least in part on the determined positions of the plurality of stations. For example, the production route may be determined based on the determined positions and sensor data (e.g., sensor data indicating the positions of obstacles in the tool 100). In some embodiments, the positions and production route are stored in the memory 1910 (FIG. 19) of the computer 103.

The teaching substrate may be rotated one or more times during the method 1000 using the pre-aligner 106, to achieve desired positioning of sensors on the teaching substrate and thus to allow desired sensor data to be obtained.

In some embodiments, the steps 1006, 1008, 1010, 1012, 1014, and/or 1016 are performed automatically, without the intervention of a user (e.g., technician or operator). Performing these steps automatically speeds the teaching process, thus reducing system downtime and increasing throughput. Performing these steps automatically also increases teaching accuracy, because human error is eliminated.

The teaching substrate is unloaded (1018) from the EFEM 101. After the teaching substrate has been unloaded, production substrates are loaded (1020) into the EFEM 101 and moved along the production route through the EFEM 101 using the substrate-handling robot 108. For example, production substrates are picked up using the end-effector 109 and moved by the substrate-handling robot 108 from station to station.

FIG. 10 shows a number of operations that appear to occur in a specific order. The method 1000, however, can include more or fewer operations. Two or more operations may be combined into a single operation. Non-order-dependent operations may be performed in a different order than shown and/or may overlap. For example, steps 1006 and 1008 may overlap. In another example, steps 1006, 1008, 1010, 1012, 1014, and/or 1016 may be performed iteratively. Other examples are possible.

FIG. 11 is a flowchart showing a method 1100 of performing automatic teaching for substrate handling in a load port 105 (FIG. 1), in accordance with some embodiments. The method 1100 may be an example of a portion of the method 900 (FIG. 9) and/or a portion of the method 1000 (FIG. 10). The method 1100 may be performed by the computer 103 (FIGS. 1 and 19).

Figure 12:
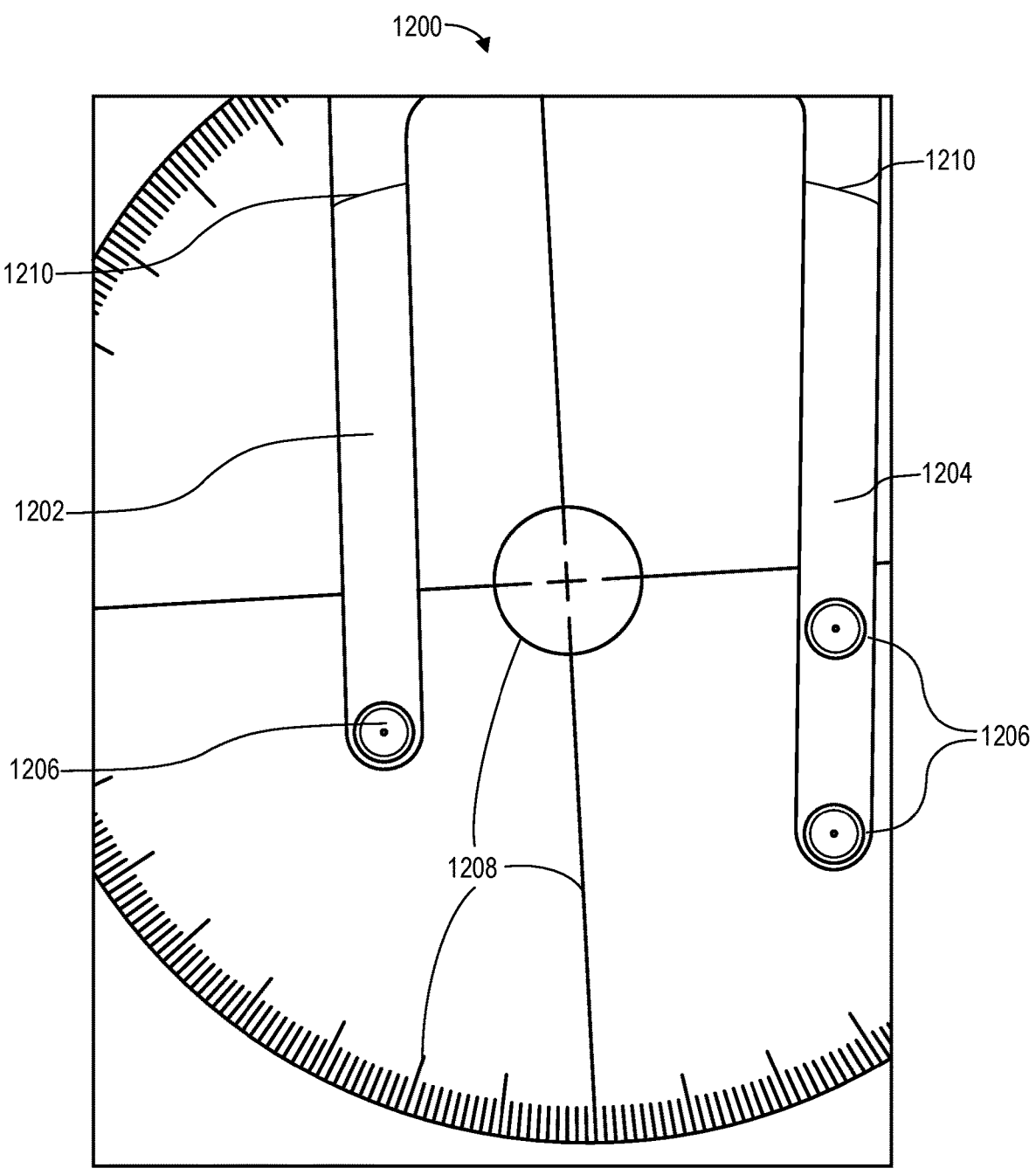
FIG. 12 is an image, taken by a camera on a teaching substrate, of a target fixture and end-effector in a substrate pod in a load port, in accordance with some embodiments.

In the method 1100, a pod 104 is loaded (1102) into a load port 105 of an EFEM 101 (FIG. 1). The pod 104 contains a teaching substrate (e.g., teaching substrate 200, FIGS. 2A-2B; 300, FIG. 3; 400, FIG. 4; 500, FIGS. 5A-5B; 2000, FIGS. 20A-20B) and a target fixture 1208 (FIG. 12). The target fixture 1208 aligns with coordinates for the pod 104; for example, the target fixture 1208 indicates a center position in the pod 104 and may also include other markings (e.g., radial markings). The teaching substrate has a plurality of sensors. The teaching substrate is oriented and sufficiently separated in the pod 104 to allow imaging of the target fixture 1208 (e.g., as described below for step 1106). For example, the target fixture 1208 is in a first slot of the pod 104 and the teaching substrate is in a last slot of the pod 104. Loading (1102) the pod 104 into the load port 105 may be an example of loading (1002, FIG. 10) the teaching substrate into the load port in the method 1000.

The end-effector 109 of a substrate-handling robot 108 in the EFEM 101 is inserted (1104) into the pod 104 (as loaded into the load port 105). Inserting the end-effector 109 into the pod 104 may be an example of, or is part of, moving (1006, FIG. 10) the substrate-handling robot 108 along the initial route. The end-effector 109 may be inserted into the substrate pod between the target fixture 1208 and the teaching substrate, with the bottom surface of the teaching substrate facing the end-effector 109.

The plurality of sensors includes a camera (e.g., camera 203 or 208, FIGS. 2A-5B) to image regions in the EFEM 101 below the teaching substrate. Sensor data are wirelessly received (1106) from the teaching substrate, including an image 1200, taken by the camera, showing the end-effector 109 and the target fixture 1208. FIG. 12 shows an example of the image 1200, with prongs 1202 and 1204 of the end-effector 109 visible above the target fixture 1208. The prongs 1202 and 1204 have vacuum pads 1206 that will be used to pick up the teaching substrate, in accordance with some embodiments. The image 1200 may be analyzed to determine the angular offset between the end-effector 109 and the teaching substrate in the pod 104 (e.g., in the coordinate system provided by the target fixture 1208). The image 1200 may also be analyzed to determine eccentricity of the end-effector 109 (i.e., the extent to which the end-effector 109 is off-center) with respect to the teaching substrate and the pod 104. For example, the location of scribes 1210 on the prongs 1202 and 1204 are used to determine the eccentricity of the end-effector 109 relative to the camera and then relative to the teaching substrate, the camera's offset in the coordinate system for the teaching substrate being known.

The substrate-handling robot 108 raises (1108) the end-effector 109 toward the teaching substrate. In some embodiments, raising the end-effector 109 includes moving (1110) the end-effector 109 along a route determined based at least in part on the image 1200: the image 1200, or multiple images including the image 1200, may be used to guide the end-effector 109 upward toward the teaching substrate. Raising the end-effector 109 may be an example of, or is part of, moving (1012, FIG. 10) the substrate-handling robot 108 along the modified route.

The plurality of sensors also includes a distance-measuring sensor 205 (FIGS. 2A, 3, 4, and 20A-20B). Sensor data are wirelessly received (1112) from the teaching substrate, including a distance of the end-effector 109 from the teaching substrate, as measured by the distance-measuring sensor 205 after raising the end-effector 109 toward the teaching substrate.

Positioning of the teaching substrate in the pod 104, as loaded into the load port 105, is determined (1114), as is positioning of the end-effector 109 in the pod 104. These determinations are made based at least in part on the image 1200 and the distance of the end-effector 109 from the teaching substrate (i.e., the distance measured in step 1112), and may be based further, at least in part, on other sensor data (e.g., other images, data from the IMU 206, etc.) from the teaching substrate and the known placement of the target fixture 1208 and the teaching substrate in the pod 104. For example, the x- and y-positions of the teaching substrate are determined relative to the target fixture 1208, using the image 1200; the angle between the end-effector 109 and the target fixture 1208 is determined, using the image 1200; the eccentricity of the end-effector 109 is determined, using the scribes 1210 as shown in the image 1200; and the z-position of the teaching substrate is determined, using the distance measured in step 1112. Determining this positioning may be part of determining (1014, FIG. 10) the positions of the plurality of stations in the method 1000, the pod 104 in the load port 105 being one of the stations. The teaching substrate may be picked up (i.e., loaded onto the end-effector 109) from its determined position.

FIG. 13 is a flowchart showing a method 1300 of performing automatic teaching for substrate handling for a pre-aligner 106, in accordance with some embodiments. The pre-aligner 106 is one of the stations in a tool 100 (FIG. 1). The method 1300 may be an example of a portion of the method 900 (FIG. 9) and/or a portion of the method 1000 (FIG. 10). The method 1300 may be performed by the computer 103 (FIGS. 1 and 19).

In the method 1300, a substrate-handling robot 108 in the EFEM 101 with a teaching substrate (e.g., teaching substrate 200, FIGS. 2A-2B; 300, FIG. 3; 400, FIG. 4; 500, FIGS. 5A-5B; 2000, FIGS. 20A-20B) on its end-effector 109 carries (1302) the teaching substrate toward the pre-aligner 106, based on a known nominal position of the pre-aligner 106. For example, the teaching substrate is carried to a "ready position" to the side of the pre-aligner 106. Carrying (1302) the teaching substrate toward the pre-aligner 106 may be an example of, or is part of, moving (1006, FIG. 10) the substrate-handling robot 108 along the initial route.

The teaching substrate has a plurality of sensors, including a first camera 210 (FIGS. 2A-5B) to image regions in the EFEM 101 to a side of the teaching substrate and a second camera (e.g., camera 203 or 208, FIGS. 2A-5B) to image regions in the EFEM 101 below the teaching substrate. Sensor data are wirelessly received (1304) from the teaching substrate, including a side image 1400 (FIG. 14A) of the pre-aligner 106 taken by the first camera 210 (e.g., from the ready position to the side of the pre-aligner 106). The pre-aligner 106 is identified in the side image 1400 using object recognition (e.g., a trained machine-learning model). In some embodiments, the substrate-handling robot 108 moves up and/or down to position the top of the pre-aligner 106 in the middle of the side image 1400, thereby estimating the height of the pre-aligner 106. The distance to the pre-aligner 106 (e.g., from the ready position to the pre-aligner 106) may be estimated based on the width of the pre-aligner 106 in the image 1400.

After the first camera 210 has taken the side image 1400 of the pre-aligner 106, the substrate-handling robot 108 moves (1306) the teaching substrate above the pre-aligner 106 (e.g., using the estimated height of and distance to the pre-aligner 106). The substrate-handling robot 108 may move (1308) the end-effector 109 above the pre-aligner 106 along a route determined based at least in part on the side image 1400 of the pre-aligner 106. Moving the teaching substrate above the pre-aligner 106 may be an example of, or is part of, moving (1012, FIG. 10) the substrate-handling robot 108 along the modified route.

In some embodiments, the substrate-handling robot 108 moves (1310) the teaching substrate to multiple successive positions above the pre-aligner 106, to determine the coordinate axes of the substrate-handling robot 108 relative to the pre-aligner 106.

Sensor data are wirelessly received (1312) from the teaching substrate, including a top image 1420 (FIG. 14B) of the pre-aligner 106 taken by the second camera (e.g., camera 203 or 208, FIGS. 2A-5B). The second camera takes the top image 1420 with the teaching substrate above the pre-aligner 106. In some embodiments, respective top images of the pre-aligner 106 taken by the second camera from respective positions (e.g., from each position) of the multiple positions are wirelessly received (1314).

The plurality of sensors also includes a distance-measuring sensor 205 (FIGS. 2A, 3, 4, and 20A-20B). Sensor data are wirelessly received (1316) from the teaching substrate, including a distance from the teaching substrate to the pre-aligner 106 (e.g., an axial distance to the pre-aligner 106). This distance is determined by the distance-measuring sensor 205 with the teaching substrate above the pre-aligner 106. The wafer-handling robot 108 may lower the teaching substrate toward the pre-aligner 106 before the distance-measuring sensor 205 measures this distance.

The location of the pre-aligner 106 (e.g., the location of the inner-most vacuum pad 1422 of the pre-aligner, FIG. 14B) is identified (1318) based at least in part on the top image 1420 and/or the distance from the teaching substrate to the pre-aligner 106. For example, object recognition (e.g., a trained machine-learning model) is used (e.g., in addition to distance-measurement data) to identify the location of the pre-aligner 106 in the top image 1420.

In some embodiments, the location of the pre-aligner 106 is identified (1320) based at least in part on the respective top images taken from the multiple positions (including the top image 1420, FIG. 14B) and/or the distance from the teaching substrate to the pre-aligner 106. The computer 103 knows the extent of movement of the wafer-handling robot 108 to reach each of the multiple locations: this movement occurs in response to commands from the computer 103 and also may be measured by the IMU 206. The computer 203 can identify the location of the pre-aligner 106 in each of the respective top images. This information (e.g., in addition to distance-measurement data) is used to identify the location of the pre-aligner 106. Identifying the location of the pre-aligner 106 may be part of determining (1014, FIG. 1) the positions of the plurality of stations in the method 1000.

Figure 17:
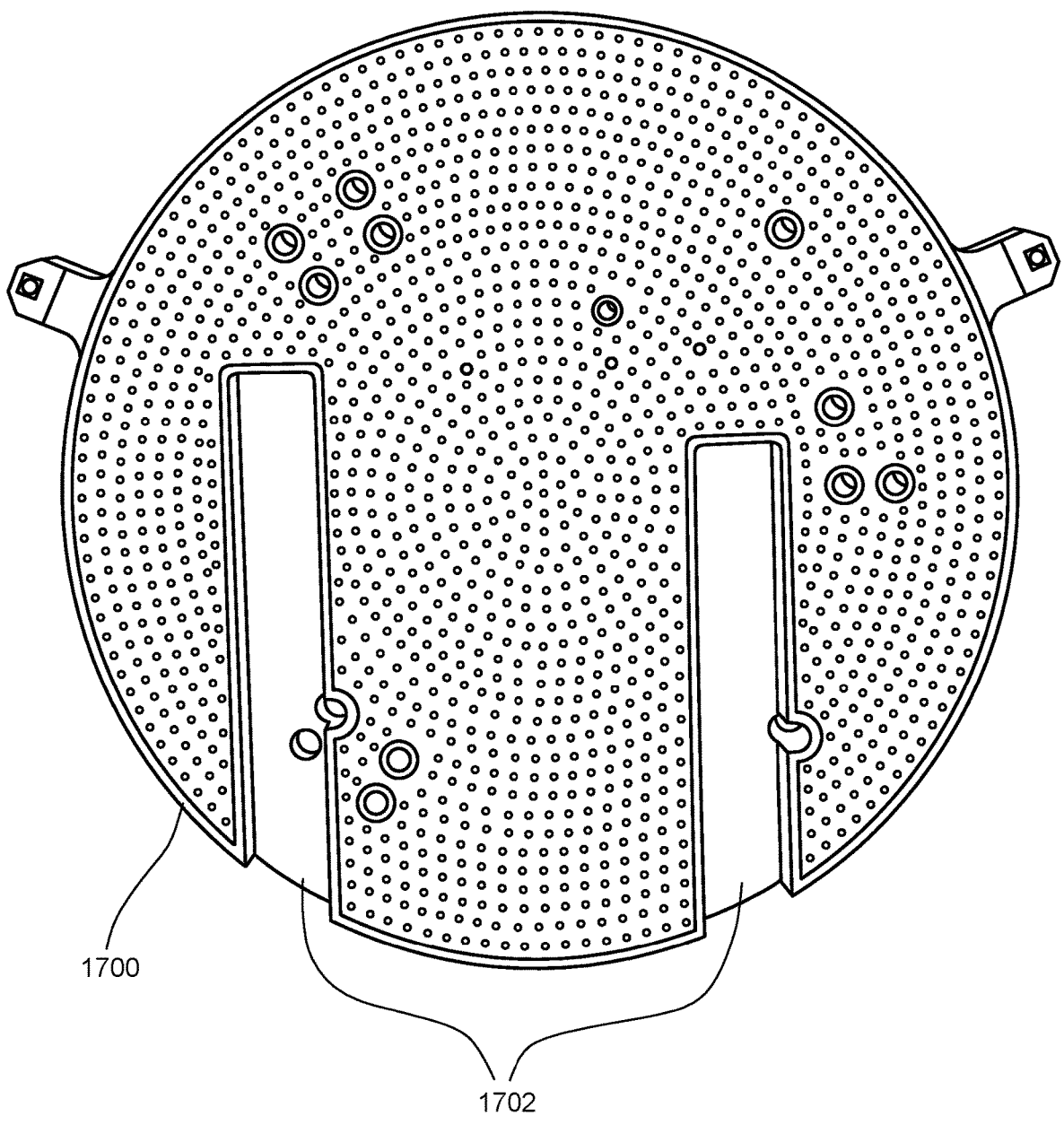
FIG. 17 is a plan view of a tool chuck, in accordance with some embodiments.

FIG. 15 is a flowchart showing a method 1500 of performing automatic teaching for a chuck 1700 (FIG. 17), in accordance with some embodiments. (FIG. 17 is a plan view of the chuck 1700, in accordance with some embodiments.) The chuck 1700 is part of a station 107 (FIG. 1), which is one of the stations in the tool 100 (FIG. 1). The chuck 1700 is shown with slots 1702 to receive the end-effector 109 (e.g., to receive respective prongs 1202 and 1204, FIG. 12). Alternatively, the chuck 1700 may use lift pins or some other mechanism to receive substrates. The chuck 1700 is thus located in the tool chamber 111 (FIG. 1) and may be referred to as a tool chuck. The method 1500 may be an example of a portion of the method 900 (FIG. 9) and/or a portion of the method 1000 (FIG. 10). The method 1500 may be performed by the computer 103 (FIGS. 1 and 19).

In the method 1500, the substrate-handling robot 108 in the EFEM 101 has (1502) an end-effector 109 to carry substrates. The tool chamber 111 in which the chuck 1700 is located is separated from the EFEM 101 by a hatch 110 (FIG. 1). A teaching substrate (e.g., teaching substrate 200, FIGS. 2A-2B; 300, FIG. 3; 400, FIG. 4; 500, FIGS. 5A-5B; 2000, FIGS. 20A-20B) has a plurality of sensors, including a first camera 210 to image regions in the EFEM to a side of the teaching substrate, a second camera 208 to image regions below the center of the teaching substrate, and/or a third camera (e.g., camera 203, FIGS. 2A-5B; camera 2002, FIGS. 20A-20B) to image regions below an edge of the teaching substrate.

With the teaching substrate on the end-effector 109, the substrate-handling robot 108 positions (1504) the teaching substrate in front of the hatch 110 with the hatch 110 in the field of view 502 (FIGS. 5A-5B) of the first camera 210. This positioning may be an example of, or is part of, moving (1006, FIG. 10) the substrate-handling robot 108 along the initial route.

Sensor data are wirelessly received (1506) from the teaching substrate, including an image of the hatch 110. The image of the hatch 110 is taken by the first camera 210 with the teaching substrate positioned in front of the hatch 110. The computer 103 may determine the position of the hatch 110 using this image. In some embodiments, the substrate-handling robot 108 uses the first camera 210 to scan along the edges of the hatch 110, or to scan up and down and left and right in front of the hatch 110, producing a series of images of the hatch 110. The computer 103 wirelessly receives these images and uses them to determine the position of the hatch 110 (e.g., of the center of the hatch 110). In some embodiments, the sensor data includes distance measurements, taken using a distance-measuring sensor 205, that the computer 103 uses to determine tilt between the teaching substrate and the hatch 110.

In some embodiments, the teaching substrate is re-positioned (1508) in front of the hatch 110 with the third camera (e.g., camera 203, FIGS. 2A-5B) facing the hatch 110. For example, the substrate-handling robot 108 returns the teaching substrate to the pre-aligner 106, which rotates the teaching substrate. The substrate-handling robot 108 then picks up the rotated teaching substrate from the pre-aligner 106 and returns the teaching substrate to a position in front of the hatch 110, with the third camera facing the hatch 110. Step 1508 may be omitted if the third camera is on the same side of the teaching substrate as the first camera 210 (e.g., if the third camera is the camera 2002, FIGS. 20A-20B).

After this re-positioning, the teaching substrate is inserted (1510) into the tool chamber 111 through the hatch 110 (the position of which has now been determined) with the teaching substrate positioned above the chuck 1700. Steps 1508 and 1510 may be an example of, or are part of, moving (1012, FIG. 10) the substrate-handling robot 108 along the modified route.

Sensor data are wirelessly received (1512) from the teaching substrate, including an image of the chuck 1700 taken by the third camera with the teaching substrate positioned above the chuck 1700. The location of the chuck 1700 is identified (1514) based at least in part on this image of the chuck 1700. For example, the boundary of the chuck 1700, or a portion of the boundary, is identified in the image, and the center of the chuck 1700 is identified based on the curvature of the boundary or portion thereof. The orientation of the chuck 1700 may be determined based on the orientation of the slots 1702 in the image. If the chuck 1700 uses lift pins instead of slots 1702, the orientation of the chuck 1700 may be determined based on the positions of all or a portion of the lift pins in the image (e.g., based on the positions of at least two of the lift pins). Identifying the location of the chuck 1700 may be part of determining (1014, FIG. 1) the positions of the plurality of stations in the method 1000.

FIG. 16 is a flowchart showing a method 1600 of performing automatic teaching for the chuck 1700 (FIG. 17), in accordance with some embodiments. The method 1600 is an alternative to the method 1500 (FIG. 15). The method 1600 may be an example of a portion of the method 900 (FIG. 9) and/or a portion of the method 1000 (FIG. 10). The method 1600 may be performed by the computer 103 (FIGS. 1 and 19).

In the method 1600, a substrate-handling robot 108 in an EFEM 101 has (1602) an end-effector 109 to carry substrates. The chuck 1700 is situated in a tool chamber 111, which is separated from the EFEM 101 by a hatch 110. A teaching substrate (e.g., teaching substrate 200, FIGS. 2A-2B; 300, FIG. 3; 400, FIG. 4; 500, FIGS. 5A-5B; 2000, FIGS. 20A-20B) has a plurality of sensors, including a first camera 210 to image regions in the EFEM 101 to a side of the teaching substrate and a distance-measuring sensor 205 facing sideways with respect to the teaching substrate.

With the teaching substrate on the end-effector 109, the substrate-handling robot 108 positions (1504) the teaching substrate in front of the hatch 110 with the hatch 110 in the field of view 502 (FIGS. 5A-5B) of the first camera 210. This positioning may be an example of, or is part of, moving (1006, FIG. 10) the substrate-handling robot along the initial route.

Sensor data are wirelessly received (1506) from the teaching substrate, including an image of the hatch 110. The image of the hatch 110 is taken by the first camera 210 with the teaching substrate positioned in front of the hatch 110. As in the method 1500 (FIG. 15), the computer 103 may determine the position of the hatch 110 using this image (e.g., using a series of images from scanning the hatch 110, including this image).

In some embodiments, the teaching substrate is re-positioned (1608) in front of the hatch 110 with the distance-measuring sensor 205 facing the hatch 110. For example, the substrate-handling robot 108 returns the teaching substrate to the pre-aligner 106, which rotates the teaching substrate. The substrate-handling robot 108 then picks up the rotated teaching substrate from the pre-aligner 106 and returns the teaching substrate to a position in front of the hatch 110, with the distance-measuring sensor 205 facing the hatch 110. Step 1608 may be omitted if the distance-measuring sensor 205 is next to the first camera 210.

After this re-positioning, the teaching substrate is inserted (1610) into the tool chamber 111 through the hatch. Steps 1608 and 1610 may be an example of, or are part of, moving (1012, FIG. 10) the substrate-handling robot 108 along the modified route. With the teaching substrate inserted into the tool chamber 111, the distance-measuring sensor 205 scans the side of the chuck 1700.

Sensor data are wirelessly received (1612) from the teaching substrate, including distance measurements taken by the distance-measuring sensor 205 while scanning the side of the chuck 1700. The location of the chuck 1700 is identified (1614) based at least in part on the distance measurements. For example, the distance measurements indicate the curvature of the side of the chuck 1700 and thus allow the position of the center of the chuck 1700 to be calculated, since the shape of the chuck 1700 is known (e.g., is circular). Identifying the location of the chuck 1700 may be part of determining (1014, FIG. 1) the positions of the plurality of stations in the method 1000.

In some embodiments, identifying the location of the chuck 1700 includes identifying (1616) the locations of the slots 1702 based at least in part on the distance measurements. Scanning the side of the chuck 1700 with the distance-measuring sensor 205 reveals the locations of the slots 1702 by finding locations at which the measured distances suddenly increase or decrease.

FIG. 18 is a block diagram of electronic components 1800 of a teaching substrate (e.g., teaching substrate 200, FIGS. 2A-2B; 300, FIG. 3; 400, FIG. 4; 500, FIGS. 5A-5B; 2000, FIGS. 20A-20B) in accordance with some embodiments. The electronic components 1800 include one or more processors 1802 (e.g., CPUs; microcontrollers), one or more wireless transceivers 207 (FIGS. 2A, 3, and 4), sensors 1808, lighting 1820, memory 1830, and one or more communication buses 1804 interconnecting these components. The one or more communication buses 1804 may be implemented using one or more circuit boards on the teaching substrate (e.g., on a top surface of the teaching substrate). The wireless transceiver(s) 207 allow the teaching substrate to communicate with the computer 103 (FIGS. 1 and 19) and/or other remote computer systems. In some embodiments, the wireless transceiver(s) 207 include WLAN (e.g., WiFi) and/or PAN (e.g., Bluetooth) transceivers.

In some embodiments, the sensors 1808 include one or more cameras 1810 (e.g., cameras 203, 208, and/or 210, FIGS. 2A-5B), one or more distance-measuring sensors 205 (FIGS. 2A, 3, and 4) (e.g., triangulator 600, FIG. 6; 700, FIG. 7; or 800, FIG. 8), an IMU 206 (FIGS. 2A, 3, and 4), and/or one or more accelerometers 1816. The accelerometer(s) 1816 may be part of the IMU 206. In some embodiments, the lighting 1820 includes one or more light-guide panels 1822 (e.g., panels 204 and/or 209, FIGS. 2A-2B; panels 302, 304, and/or 306, FIG. 3) and/or LEDs 1824 (e.g., LEDs 402 and/or 404, FIG. 4).

Memory 1830 includes volatile and/or non-volatile memory. Memory 1830 (e.g., the non-volatile memory within memory 1830) includes a non-transitory computer-readable storage medium. All or a portion of the memory 1830 (e.g., non-volatile memory of the memory 1830) may be embedded in the processor(s) 1802. For example, the memory 1830 may include non-volatile memory embedded in a microcontroller. Memory 1830 optionally includes one or more storage devices remotely located from the processor(s) 1802. In some embodiments, memory 1830 (e.g., the non-transitory computer-readable storage medium of memory 1830) stores the following modules and data, or a subset or superset thereof: an operating system 1832 for handling various basic system services and for performing hardware-dependent tasks, a sensor calibration module 1834 for calibrating the sensors 1808 and storing resulting calibration data, a sensor control module 1836 for controlling the sensors 1808, a lighting control module 1838 for controlling the lighting 1820, and a communication module 1840 for controlling wireless communications with the compute 103 and/or other remote computer systems (e.g., communications performed using the one or more wireless transceivers 207). In some embodiments, the sensor control module 1836 turns respective sensors 1808 on and off, reads sensor data, compresses sensor data, stores sensor data in the memory 1830 (e.g., if communication with the computer 103 fails), reads the status of respective sensors 1808, and/or checks whether the battery status is adequate to operate the sensors 1808. The communication module 1840 may send calibration and sensor data to the computer 103 and receive commands from the computer 103. In some embodiments, the sensor calibration module 1834, sensor control module 1836, and lighting control module 1838 execute commands received wirelessly from the computer 103.

The memory 1830 (e.g., the non-transitory computer-readable storage medium of the memory 1830) thus includes instructions for achieving the functionality of a teaching substrate. Each of the modules stored in the memory 1830 corresponds to a set of instructions for performing one or more functions described herein. Separate modules need not be implemented as separate software programs. The modules and various subsets of the modules may be combined or otherwise re-arranged. In some embodiments, the memory 1830 stores a subset or superset of the modules identified above.

FIG. 18 is intended more as a functional description of the various features that may be present on a teaching substrate than as a structural schematic. For example, a portion of the modules stored in the memory 1830 may alternatively be stored in one or more computer systems wirelessly communicatively coupled with the teaching substrate through one or more networks.

FIG. 19 is a block diagram of the computer 103 (FIG. 1) in accordance with some embodiments. The computer 103 is communicatively coupled to a fabrication or inspection tool 100 (FIG. 1); in some embodiments, the computer 103 is part of the tool 100. The computer 103 includes one or more processors 1902 (e.g., CPUs), one or more wireless transceivers 1906, memory 1910, and one or more communication buses 1904 interconnecting these components. In some embodiments, the one or more communication buses 1904 interconnect these components with the tool 100. In some other embodiments, the computer 103 also includes a wireline network interface that it uses to communicate with the tool 100 through one or more wired networks. In still other embodiments, the computer 103 communicates with the tool 100 wirelessly, using the wireless transceiver(s) 1906. In some embodiments, the wireless transceiver(s) 1906 include WLAN (e.g., WiFi) and/or PAN (e.g., Bluetooth) transceivers.

The computer 103 may include one or more user interfaces (not shown), such as a display and one or more input devices (e.g., a keyboard, mouse, touch-sensitive surface of the display, etc.). The display may show sensor data (e.g., images) received from a teaching substrate in the tool 100 and may report the status of the methods described herein.

Memory 1910 includes volatile and/or non-volatile memory. Memory 1910 (e.g., the non-volatile memory within memory 1910) includes a non-transitory computer-readable storage medium. Memory 1910 optionally includes one or more storage devices remotely located from the processor(s) 1902 and/or a non-transitory computer-readable storage medium that is removably inserted into the computer 103. In some embodiments, memory 1910 (e.g., the non-transitory computer-readable storage medium of memory 1910) stores the following modules and data, or a subset or superset thereof: an operating system 1912 that includes procedures for handling various basic system services and for performing hardware-dependent tasks, an EFEM control module 1914 for controlling the EFEM 101 (e.g., including the load ports 105, wafer-handling robot

108, pre-aligner 106, and hatch 110, FIG. 1), a tool-chamber control module 1916 for controlling the tool chamber 111 (e.g., for controlling substrate fabrication or inspection performed in the tool chamber 111), and an auto-teaching module 1918 for controlling performance of an automatic teaching process for substrate handling. In some embodiments, the auto-teaching module 1918 includes a teaching-substrate command module 1920 for determining commands for a teaching substrate and sending the commands to the teaching substrate, a position-determination module 1922 for determining the positions of stations in the tool 100, a route-determination module 1924 for determining a route for the substrate-handling robot 108 and for substrates being handled by the substrate-handling robot 108, and data 1926 (e.g., data 904, 906 and/or 908 of the method 900, FIG. 9; sensor data received from a teaching substrate).

The memory 1910 (e.g., the non-transitory computer-readable storage medium of the memory 1910) (e.g., the auto-teaching module 1918 and/or the EFEM control module 1914) includes instructions for performing all or a portion of the methods 900 (FIG. 9), 1000 (FIG. 10), 1100 (FIG. 11), 1300 (FIG. 13), 1500 (FIG. 15), and/or 1600 (FIG. 16). Each of the modules stored in the memory 1910 corresponds to a set of instructions for performing one or more functions described herein. Separate modules need not be implemented as separate software programs. The modules and various subsets of the modules may be combined or otherwise re-arranged. In some embodiments, the memory 1910 stores a subset or superset of the modules and/or data structures identified above.

FIG. 19 is intended more as a functional description of the various features that may be present in the computer 103 than as a structural schematic. For example, the functionality of the computer 103 may be split between multiple devices. A portion of the modules stored in the memory 1910 may alternatively be stored in one or more other computer systems communicatively coupled with the computer 103 through one or more networks.

The methods and hardware described herein allow quick and accurate teaching of a substrate-handling robot 108. For example, the teaching may be fully automated, such that intervention by a technician (e.g., beyond loading the pod 104 in a load port 105) is avoided and human error is eliminated. The teaching may be performed using no data beyond the data stored in the computer 103 (e.g., the data 904, 906, and 906 of the method 900, FIG. 9). The teaching may be performed without installing additional hardware (e.g., sensors) in the tool 100 for the teaching process.

The foregoing description, for purpose of explanation, has been described with reference to specific embodiments. However, the illustrative discussions above are not intended to be exhaustive or to limit the scope of the claims to the precise forms disclosed. Many modifications and variations are possible in view of the above teachings. The embodiments were chosen in order to best explain the principles underlying the claims and their practical applications, to thereby enable others skilled in the art to best use the embodiments with various modifications as are suited to the particular uses contemplated.

What is claimed is:

1. An apparatus, comprising:
   a substrate to be loaded into an equipment front-end module of a fabrication or inspection tool;
   a first camera positioned on the substrate to image regions to a side of the substrate;
   a second camera positioned on the substrate to image regions below the center of the substrate;

a third camera positioned on the substrate to image regions below an edge of the substrate; and one or more wireless transceivers on the substrate to transmit images captured by the first, second, and third cameras.

2. The apparatus of claim 1, further comprising a fourth camera positioned on the substrate to image regions below the first camera.

3. The apparatus of claim 2, wherein the third camera and the fourth camera face sideways with respect to the substrate, the apparatus further comprising:

a first mirror to direct a view of the third camera to the regions below the edge of the substrate; and a second mirror to direct a view of the fourth camera to the regions below the first camera.

4. The apparatus of claim 1, wherein:

the fabrication or inspection tool is a tool for fabricating or inspecting semiconductor wafers;

the substrate is wafer-shaped;

the first camera, second camera, and third camera are positioned along a diameter of the substrate; and the third camera and the first camera are on opposite sides of the second camera along the diameter.

5. The apparatus of claim 1, wherein:

the first camera, second camera, and third camera are on top of the substrate;

the first camera faces sideways with respect to the substrate;

the second and third cameras face downward with respect to the substrate; and the substrate is transparent.

6. The apparatus of claim 1, wherein:

the first camera, second camera, and third camera are on top of the substrate;

the first camera faces sideways with respect to the substrate;

the second camera faces sideways with respect to the substrate; and the apparatus further comprises a mirror to direct a view of the second camera to the regions below the center of the substrate.

7. The apparatus of claim 1, wherein:

the first camera, second camera, and third camera are on top of the substrate;

the first camera faces sideways with respect to the substrate;

the second and third cameras face downward with respect to the substrate; and the substrate has a first hole to provide the second camera with a view of the regions below the center of the substrate and a second hole to provide the third camera with a view of the regions below the edge of the substrate.

8. The apparatus of claim 1, further comprising lighting for the first camera, second camera, and third camera.

9. The apparatus of claim 8, wherein the lighting comprises a first light-guide panel, facing downward with respect to the substrate, to illuminate the regions below the center of the substrate for imaging by the second camera and the regions below the edge of the substrate for imaging by the third camera.

10. The apparatus of claim 9, wherein the lighting further comprises a second light-guide panel, facing sideways with respect to the substrate, to illuminate the regions to the side of the substrate for imaging by the first camera.

11. The apparatus of claim 8, wherein the lighting comprises:

a first plurality of light-emitting diodes (LEDs), facing downward with respect to the substrate, to illuminate the regions below the center of the substrate for imaging by the second camera and the regions below the edge of the substrate for imaging by the third camera; and a second plurality of LEDs, facing sideways with respect to the substrate, to illuminate the regions to the side of the substrate for imaging by the first camera.

12. An apparatus comprising:

a substrate to be loaded into an equipment front-end module of a fabrication or inspection tool;

a first camera positioned on the substrate to image regions to a side of the substrate;

a second camera positioned on the substrate to image regions below the substrate; and a distance-measuring sensor positioned on the substrate facing downward with respect to the substrate to measure a distance to a surface below the substrate; and one or more wireless transceivers on the substrate to transmit images captured by the first and second cameras and data from the distance-measuring sensor, the data from the distance-measuring sensor comprising the distance.

13. The apparatus of claim 12, wherein the distance-measuring sensor comprises a triangulator.

14. The apparatus of claim 13, wherein the triangulator comprises:

a pair of collimated-light sources to produce collimated beams;

a lens to focus the collimated beams;

a mirror to fold the collimated beams and reflections of the collimated beams;

a pair of segmented photodiodes to receive the reflections of the collimated beams; and a pair of beam splitters to provide the collimated beams to the lens and to provide the reflections of the collimated beams to the pair of segmented photodiodes, wherein the lens is to direct the reflections of the collimated beams to the pair of beam splitters.

15. The apparatus of claim 13, wherein the triangulator comprises:

a collimated light source to produce a collimated beam;

a folding mirror to direct the collimated beam downward through the teaching substrate at an oblique angle; and an imager to detect a location at which the collimated beam, as directed downward at the oblique angle by the folding mirror, is incident on the surface.

16. An apparatus comprising:

a substrate to be loaded into an equipment front-end module of a fabrication or inspection tool;

a first camera positioned on the substrate to image regions to a side of the substrate;

a second camera positioned on the substrate to image regions below the substrate;

a distance-measuring sensor positioned on the substrate facing sideways with respect to the substrate to measure a distance to a surface beside the substrate; and one or more wireless transceivers on the substrate to transmit images captured by the first and second cameras and data from the distance-measuring sensor, the data from the distance-measuring sensor comprising the distance.

17. The apparatus of claim 1, further comprising an accelerometer on the substrate, wherein the one or more wireless transceivers are to transmit data from the accelerometer, the data comprising acceleration measurements from the accelerometer.

18. The apparatus of claim 1, wherein the substrate is reticle-shaped.

19. The apparatus of claim 1, wherein the one or more wireless transceivers comprise a wireless local-area-network (WLAN) transceiver.

20. The apparatus of claim 1, wherein the one or more wireless transceivers comprise a personal-area-network (PAN) transceiver.

\*    \*    \*    \*    \*